United States Patent
Mizuno et al.

(10) Patent No.: US 6,683,503 B2
(45) Date of Patent: *Jan. 27, 2004

(54) SEMICONDUCTOR INTEGRATED CIRCUIT HAVING OSCILLATORS OR OSCILLATION CIRCUITS CONNECTED TO A WIRING LINE AT CONNECTION POINTS WITH INTERVALS IN LENGTH THEREBETWEEN

(75) Inventors: Hiroyuki Mizuno, Kokubunji (JP); Hirokazu Aoki, Hachiouji (JP); Koichiro Ishibashi, Warabi (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 192 days.

(21) Appl. No.: 09/141,343

(22) Filed: Aug. 27, 1998

(65) Prior Publication Data

US 2002/0003452 A1 Jan. 10, 2002

(30) Foreign Application Priority Data

Aug. 28, 1997 (JP) ............................................. 9-232052

(51) Int. Cl.⁷ ............................................... H03B 27/00
(52) U.S. Cl. ............................ 331/46; 331/57; 327/141; 327/144; 713/500; 713/503
(58) Field of Search ........................... 331/57, 2, 108 C, 331/46; 713/500, 503; 327/141–144

(56) References Cited

U.S. PATENT DOCUMENTS

| | | | |
|---|---|---|---|
| 5,347,234 A | | 9/1994 | Gersbach et al. ............... 331/57 |
| 5,357,217 A | | 10/1994 | Marchesi et al. ............... 331/57 |
| 5,475,344 A | * | 12/1995 | Maneatis et al. ............... 331/57 |
| 5,592,127 A | * | 1/1997 | Mizuno ......................... 331/57 |
| 5,933,623 A | * | 8/1999 | Umemura et al. ........... 713/400 |
| 6,104,253 A | * | 8/2000 | Hall et al. ...................... 331/56 |

OTHER PUBLICATIONS

IEEE Journal of Solid–State Circuits, A PLL Clock Generator with 5 to 110 MHz of Lock Range for Microprocessors, vol. 27, No. 11, Nov. 1992.

* cited by examiner

Primary Examiner—Arnold Kinkead
(74) Attorney, Agent, or Firm—Mattingly, Stanger & Malur, P.C.

(57) ABSTRACT

An oscillation circuit provides clock signals and a clock distribution circuit or system of circuits having low skew and low jitter to logic circuits and memory circuits of a microprocessor or the like. Further, a semiconductor integrated circuit device of high speed is provided as a result of the stable clock signal that is generated and distributed. The oscillation circuit is in a semiconductor integrated circuit device having a plurality of oscillators each having an oscillation node, wherein the oscillation nodes of each of the oscillators are connected together by a conductive wiring line that may be a closed loop. The oscillators are synchronized to oscillate at substantially the same frequency. The oscillators are connected to the conductive wiring line at connecting points having substantially the same interval of conductive wiring lengths between the connection points, which leads to synchronizing the oscillators to oscillate with a substantially identical phase. The conductive wiring line can also be formed in the shape of a mesh with the interval of length of the conductive wiring line between the connection points being at least 50 $\mu$m. The oscillators are ring oscillation circuits having inverters connected in a ring shape wherein an output of at least one inverter of each ring oscillation circuit is connected to the conductive wiring. Alternatively, the oscillators may be delay lines having multistage connected inverters with at least one inverter connected to the conductive wiring line.

17 Claims, 20 Drawing Sheets

SEMICONDUCTOR INTEGRATED CIRCUIT HAVING OSCILLATORS OR OSCILLATION CIRCUITS CONNECTED TO A WIRING LINE AT CONNECTION POINTS WITH INTERVALS IN LENGTH THEREBETWEEN

FIELD OF THE INVENTION

The present invention relates to an oscillation circuit, and a semiconductor integrated circuit device which includes a clock distribution system of low jitter and low skew employing the oscillation circuit.

BACKGROUND OF THE INVENTION

A clock generation method which uses a conventional PLL (Phase-locked loop) is disclosed in, for example, IEEE JOURNAL OF SOLID-STATE CIRCUITS, VOL 27, NO 11, November 1992 (hereinbelow, referred to as the "prior art example A").

FIG. 2 illustrates the construction of a clock generation unit which employs the conventional PLL. A reference clock signal fext input to the PLL from outside the circuit. The PLL includes the following: "PFD", a phase/frequency comparator; "CP", a charge pump; "LPF", a low-pass filter; "VCO0", a voltage-controlled oscillator; "DIVN", a 1/N frequency divider; "DIV2", a ½ frequency divider; and "N0", a clock distribution network. The details of each of these circuit elements is omitted.

The difference between the phases or frequencies of the reference clock signal fext and an internal clock signal fint is compared by the phase/frequency comparator PFD, from which an error signal UP or DN is output. The error signal is converted into an analog signal by the charge pump CP, and the high frequency components of the signal are removed by the low-pass filter LPF. The resulting signal is input to the voltage-controlled oscillator VCO0 as an oscillation-frequency control signal VC. The oscillation output of the voltage-controlled oscillator VCO0 is divided by the frequency divider DIV2 into an oscillation output fint0 whose frequency is half the frequency of the former oscillation output and whose duty ratio is 50%, and which is input to the clock distribution network N0.

The return signal fint from the clock distribution system has its frequency divided by the 1/N frequency divider DIVN. The resulting signal is input to the phase/frequency comparator PFD. The phases of the reference clock fext and internal clock fint are locked by such a phase-locked loop PLL0, and the frequency of the signal fint becomes N times that of the signal fext.

SUMMARY OF THE INVENTION

The frequency of the internal clock fint has increased year by year, and the area of the clock distribution network N0 has been enlarged in accordance with increases in chip area. Problems occur in a clock distribution system when the clock is to be stably fed at high speed over a wide area. Such problems, as mentioned below, occur with the prior art Example A.

(1) The delay time of the clock distribution network, that is, the delays in the signals fint0 and fint, become(s) relatively long in comparison with 1/fint. Thus, the skew of the clock distribution network influences the performance of the whole clock distribution system into which the clock distribution network and the phase-locked loop PLL0 are combined. Also, there is a method wherein a clock feed range within a chip is split in a large number, and wherein independent PLLs are provided for the respective clock feed subranges. In the case of this method, however, problems as mentioned below are involved.

(2) In general, a PLL is less immune to noise such as power source noise and substrate noise, and such noise increases the "jitter" of the oscillation frequency and phase of the signal fint0. The provision of the large number of PLLs within the chip leads to the necessity of considering noise reduction for each of the PLLs.

(3) The total area of the large number of PLLs affects the area of the entire chip. In consideration of the problem (2), the area of each of the PLLs increases even more.

(4) The clock skew between the independent clock feed subranges becomes as very large as TskewG+2*TskewL+2*Tjitter, where TskewL denotes a skew within the respective clock feed subranges, Tjitter denotes the jitter of the PLLs, and TskewG denotes the skew of the reference clock having occurred up to each PLL.

(5) Since the PLLs are provided in such a large number, dissipation power increases.

The objects of the invention are to solve the aforementioned problems by providing an oscillation circuit and a semiconductor integrated circuit device which includes a clock distribution system using the oscillation circuit.

In particular, it is an object of the invention to provide a semiconductor integrated circuit device having a plurality of oscillators each having an oscillation node, wherein the oscillation nodes of each of the oscillators are connected together. Preferably, the oscillators are connected together by conductive wiring line that may be a closed loop.

It is a further object of the invention that the oscillators are synchronized to oscillate at substantially the same frequency and further to oscillate at substantially the same phase.

It is another object of the invention that the oscillators are connected to a wiring at connecting points having substantially the same interval of wiring lengths between the connection points, which leads to synchronizing the oscillators to oscillate at a substantially identical frequency and phase.

In a preferred embodiment of the invention, the semiconductor integrated circuit device has a plurality of oscillators that are connected to a conductive wiring line that is formed in the shape of a mesh, at the intersection points of the mesh, wherein the interval of length of the conductive wiring line between the connection points is substantially the same among all of the connection points. Preferably, the interval length is at least 50 $\mu$m.

In a further object of the present invention, the oscillators are ring oscillation circuits having inverters connected in a ring shape wherein an output of at least one inverter of each ring oscillation circuit is connected to the conductive wiring. Alternatively, the oscillators may be delay lines having multistage connected inverters with at least one inverter connected to the conductive wiring line.

According to another object of the invention, a semiconductor integrated circuit device is provided with a plurality of circuit blocks having a clock distribution circuit and a plurality of oscillators that output a clock signal to the clock distribution circuit in which a conductive wiring is provided for connecting oscillation nodes of each of the oscillators together. In such an arrangement, the circuit blocks may comprise a logic circuit or a memory circuit and the plurality of oscillators may be provided in one-to-one correspondence with the plurality of circuit blocks.

In still another object of the invention, a semiconductor integrated circuit device has a plurality of oscillation circuits with a wiring connecting the output of oscillation circuits together, a plurality of clock distribution circuits that are connected to the oscillation circuits and a phase frequency converter that compares the clock signal of the clock distribution circuits with a reference clock signal wherein the oscillation circuits change in oscillation frequency in response to a signal output from a phase frequency comparator.

According to the present invention, a semiconductor integrated circuit device is provided having a plurality of oscillators having substantially the same natural oscillation frequency and a conductive wiring that connects the outputs of each of the oscillators together. As a result, the oscillators oscillate at substantially the same frequency independently of fluctuations in the supply of voltage to each of the oscillators. Further, since the oscillators are synchronized to provide substantially the same output frequency which is independent of fluctuations in the supply voltages, the oscillators are suitable for providing a clock signal to a plurality of clock distribution circuits that distribute clock signals to circuit blocks on the semiconductor integrated circuit device. As a result, a clock signal is provided that is distributed according to the preferred embodiments of the invention that is not subject to variations due to noise and therefore has low jitter and skew.

DETAILED DESCRIPTION OF THE PREFERRED EMBODIMENTS

Figure 1:
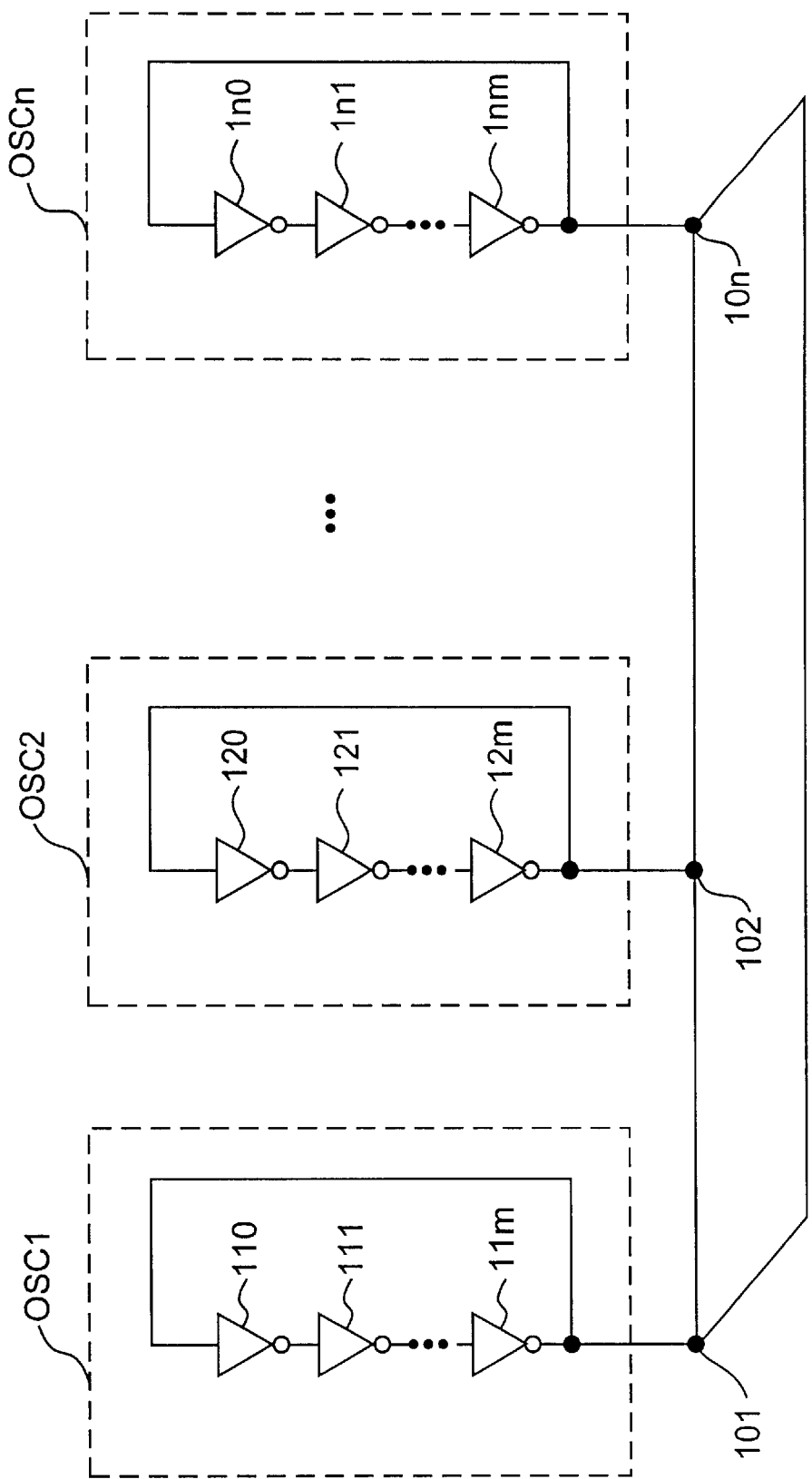
FIG. 1 is a diagram showing the basic embodiment of the present invention.
Figure 2:
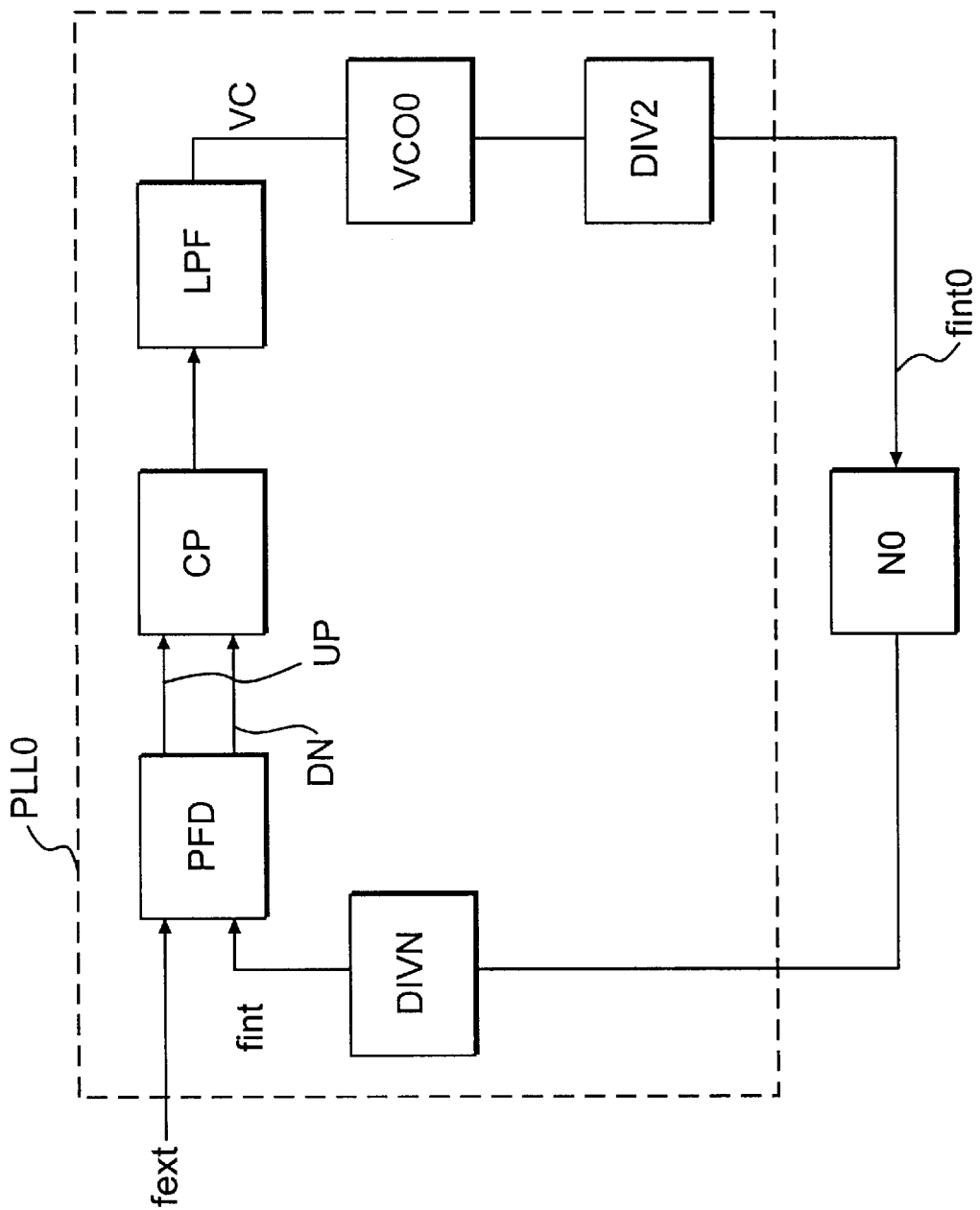
FIG. 2 is a diagram showing a clock generation unit which employs a conventional PLL.

FIG. 1 is a diagram showing a basic embodiment of the oscillation circuit of the present invention, which includes ring oscillators OSC1–OSCn, which are respectively configured of inverters 110–11$m$, 120–12$m$, and 1$n$0–1$nm$. One of the oscillation nodes of each of the ring oscillators is connected to the corresponding one of nodes 101–10$n$, and the adjacent nodes 101–10$n$ are connected together by the wiring, which is preferably in a closed loop shape. Also, preferably, the interval of wiring length or distance between the adjacent nodes (for example, the distance between the nodes 101 and 102) are equal distances 1. The inverters 110–11$m$, 120–12$m$, and 1$n$0–1$nm$ may be CMOS inverters, although not limited thereof. For the sake of brevity, inverters of the CMOS type are described as employed in the description of FIG. 1 below.

Since the oscillation nodes of the respective ring oscillators OSC1–OSCn are connected with one another, these ring oscillators OSC1 thru OSCn oscillate at a substantially identical phase/frequency.

Figure 3A:
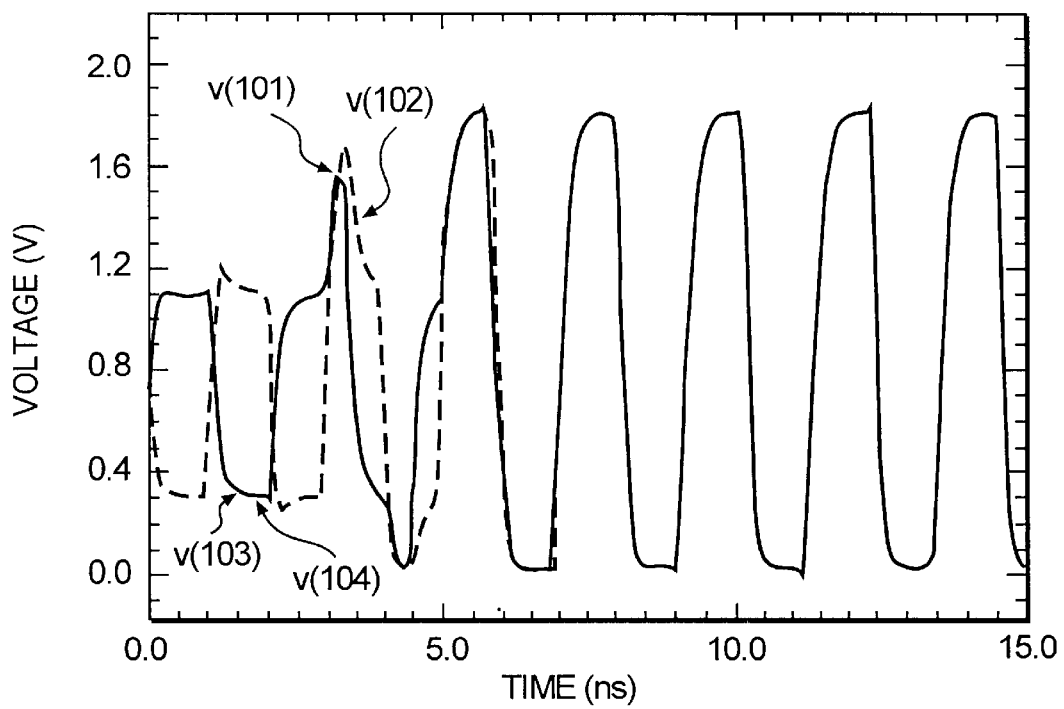
FIGS. 3(A,B) shows graphs illustrating the circuit simulation waveforms of the oscillation circuits according to the present invention.

FIG. 3(A) illustrates circuit simulation waveforms in the case where the number of ring oscillators is four. The axis of abscissa represents the time, while the axis of ordinate represents the voltages of the respective nodes. In the figure, V(x), i.e. V(101), V(102), etc. denotes the potential of the node x. Transistors used in the simulation were CMOS transistors each of which had a gate length Lg of 0.25 $\mu$m. The inverters 110–11$m$, 120–12$m$, and 1$n$0–1$nm$ were all the same type of inverters (in which the gate width Wp of each PMOS transistor was 10 $\mu$m, and the gate width Wn of each NMOS transistor was 5 $\mu$m). A supply voltage was 1.8 V, and the distance l between the nodes was 3 mm. It was assumed that in an initial state, the respective nodes 101–104 had different potentials as their initial values (at the point of time of 0 ns). It is seen that, although there were in different phases at the time point 0 ns, the ring oscillators OSC1 thru OSC4 oscillated in and at an identical phase/frequency in a steady state established after a while subsequent to time point 0 ns.

In this manner, as a result of the configuration of the present invention, the ring oscillators, the adjacent ones of which are spaced apart from one another by the distance l, can be caused to oscillate in and at an identical phase/ frequency. The distance l may range from 1 μm to 10 mm. There is the advantage that the frequency of the oscillations do not depend upon the respective distances.

Although, in the foregoing, the distances between the respectively adjacent nodes in FIG. 1 are all set to be equal distances l, they need not always be equal distances. In such a case, in the steady state, the oscillations of the respective ring oscillators will have a substantially identical frequency, but they will not have an identical phase. The respective ring oscillators oscillate in synchronism while keeping phases δ1-δn (if the distances between the respectively adjacent nodes are all equal distances l, then δ1=δ2= . . . =δn holds).

Figure 4:
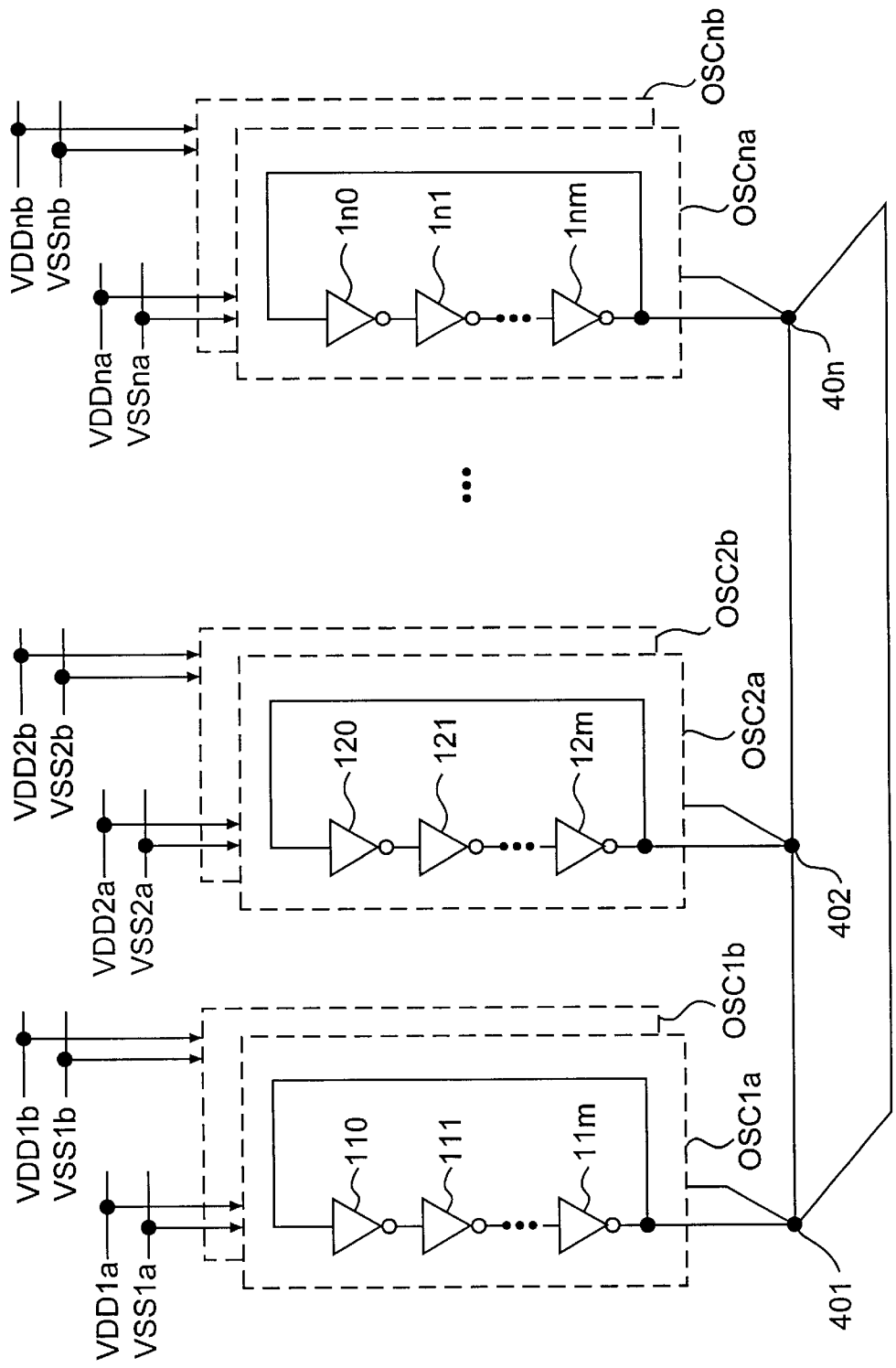
FIG. 4 is a diagram of an embodiment in which ring oscillators are connected to separate power sources in an oscillation circuit of the present invention.

Further, although the inverters 110–11*m*, 120–12*m*, and 1*n*0–1*nm* constituting the respective ring oscillators are all shown in FIG. 4 to be of the same type, they need not always be of the same type. If they are not the same, the respective ring oscillators oscillate with substantially identical frequency, but not in identical phase in the steady state as in the foregoing. The respective ring oscillators oscillate in synchronism while having the phases δ1-δn. To the contrary, the phases δ1-δn can be changed by adjusting the sorts (load driving capabilities, etc.) of the inverters of the respective ring oscillators. The phases δ1-δn of the respective ring oscillators can be brought into substantially identical phase by adjusting the sorts of the inverters of the respective ring oscillators through the utilization of such a property, even when all the distances between the respectively adjacent nodes are not set at the equal distances l.

In general, since the inverters 11*m*–1*nm* need to drive the nodes 101–10*n* and the wiring line connecting them, each of them requires a load driving capability being comparatively high (for which the gate widths are enlarged in the case of the CMOS transistors). For lowering power dissipation, accordingly, it is effective to make the load driving capabilities higher in the order of, for example, the inverters 110, 111, . . . and 11*m*.

Further, the numbers of stages of the inverters need not be the same in the ring oscillators. If the natural oscillation frequencies of the ring oscillators are equal to some extent, the construction of the present invention can cause the respective ring oscillators to oscillate at an identical frequency in synchronism with the phases δ1-δn kept, in the steady state.

Next, there will be explained the characteristics for the case in which noise such as a supply voltage fluctuation or a substrate voltage fluctuation has acted on the oscillators of the present invention.

Figure 3B:
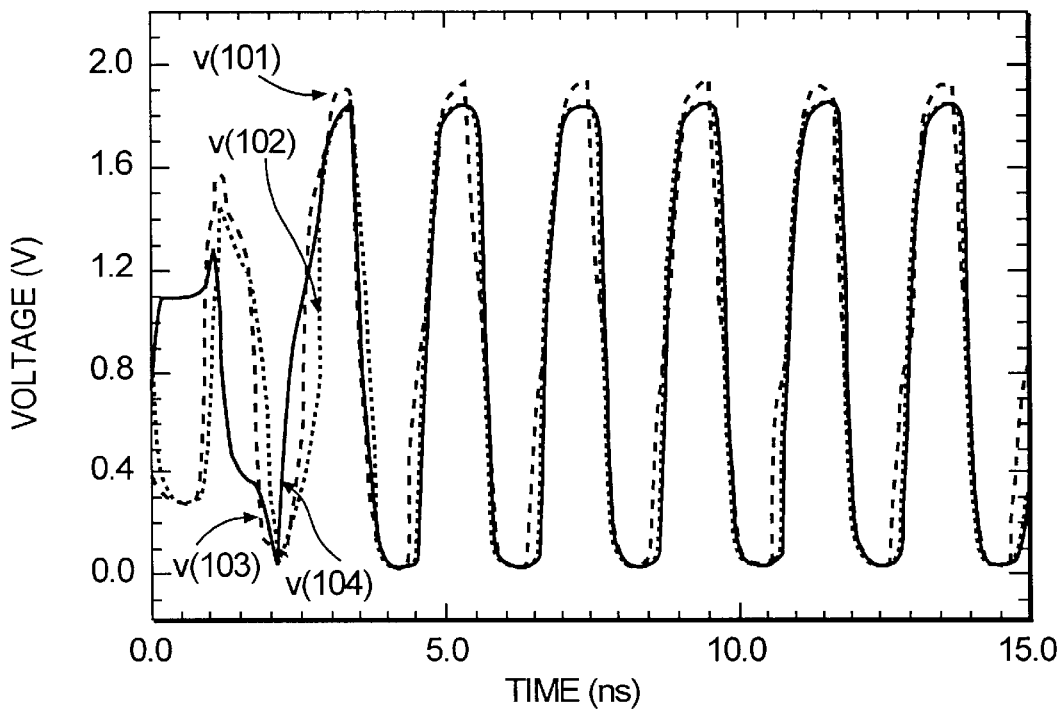

FIG. 3(B) illustrates circuit simulation waveforms in the case where only the ring oscillator OSC1 has a supply voltage different from that of the other ring oscillators. The supply voltage of the ring oscillator OSC1 was 2.0 V, and the other conditions were the same as those for the simulation of FIG. 3(A). It is seen that the ring oscillators OSC1 thru OSC4 oscillate in and at substantially the identical phase/frequency in a steady state established after a while subsequent to the point of time 0 ns.

The oscillation circuit of the present invention is configured of a large number of ring oscillators with the feature that, even when the supply voltages of the several constituent ring oscillators have fluctuated, the phase/frequency of the whole oscillation circuit hardly changes (in the case where the ring oscillators have the phases δ1-δn in the steady state involving neither the supply voltage fluctuation nor the substrate voltage fluctuation, they function to keep the phases against the supply voltage fluctuation and the substrate voltage fluctuation).

This effect becomes greater with an arrangement in which the supply voltage fluctuation having acted on the ring oscillator does not influence the supply voltages of the other ring oscillators. In general, the supply voltage fluctuation in an integrated circuit arises in a local place. Therefore, in a case where a power source is shared by a plurality of ring oscillators, the longer distance l is better. Further, it is preferable that the respective ring oscillators do not share the power source, as much as practical. By way of example, separate supply voltage generators or supply voltage stabilizers may well be employed for the respective ring oscillators.

Although the effect of the present invention concerning the supply voltage fluctuation has been mentioned in the foregoing, the same holds true of the substrate voltage fluctuation.

FIG. 4 illustrates an embodiment of the present invention which takes advantage of the above discussed noise immunity considerations, according to the present invention. As compared with the embodiment of FIG. 1, the embodiment in FIG. 4 differs in the point that the respective ring oscillators OSC1–OSCn are configured of pairs of ring oscillators (OSC1*a*, OSC1*b*)-(OSC*na*, OSC*nb*). Further, the ring oscillator pairs are connected to different supply voltages VDD1*a*-VDD*na* as well as VSS1*a*-VSS*na* and VDD1*b*-VDD*nb* as well as VSS1*b*-VSS*nb*.

The probabilities at which the noise such as the supply voltage fluctuations are simultaneously involved in the supply voltages VDD1*a*-VDD*na* as well as VSS1*a*-VSS*na* and the supply voltages VDD1*b*-VDD*nb* as well as VSS1*b*-VSS*nb*, are low owing to the localities of the noise. It is therefore possible to suppress the fluctuations of oscillation frequencies and phases at nodes 401–40*n* as are attributed to the supply voltage fluctuations, the substrate voltage fluctuations, etc.

The effect of the present invention as stated above resembles the effect of a so-called bypass capacitor (decoupling capacitor) which is interposed between supply voltages in order to suppress supply voltage fluctuations. The pass capacitor functions to hold a predetermined potential in a case where noise exists in a signal having a predetermined potential (the potential termed the supply voltage) in the state in which the noise does not exist. On the other hand, the oscillator of the present invention functions to hold the predetermined oscillation frequency/phase in the case where noise exists in the signal having the predetermined frequency/phase in the steady state in which the noise does not exist.

Figure 5:
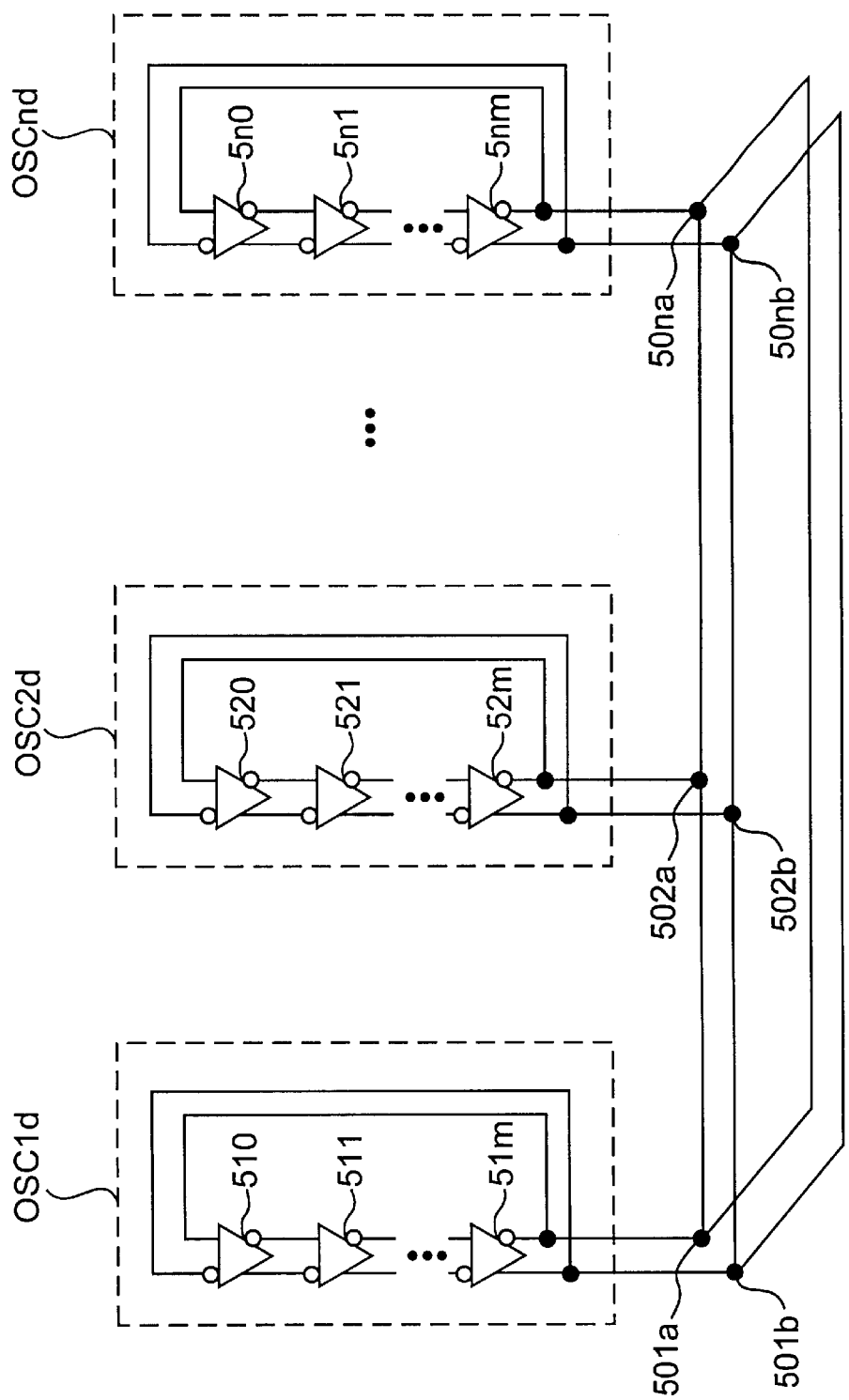
FIG. 5 is a diagram of an embodiment pf an oscillation circuit according to the invention in which differential inverters are employed in the ring oscillators.
Figure 11:
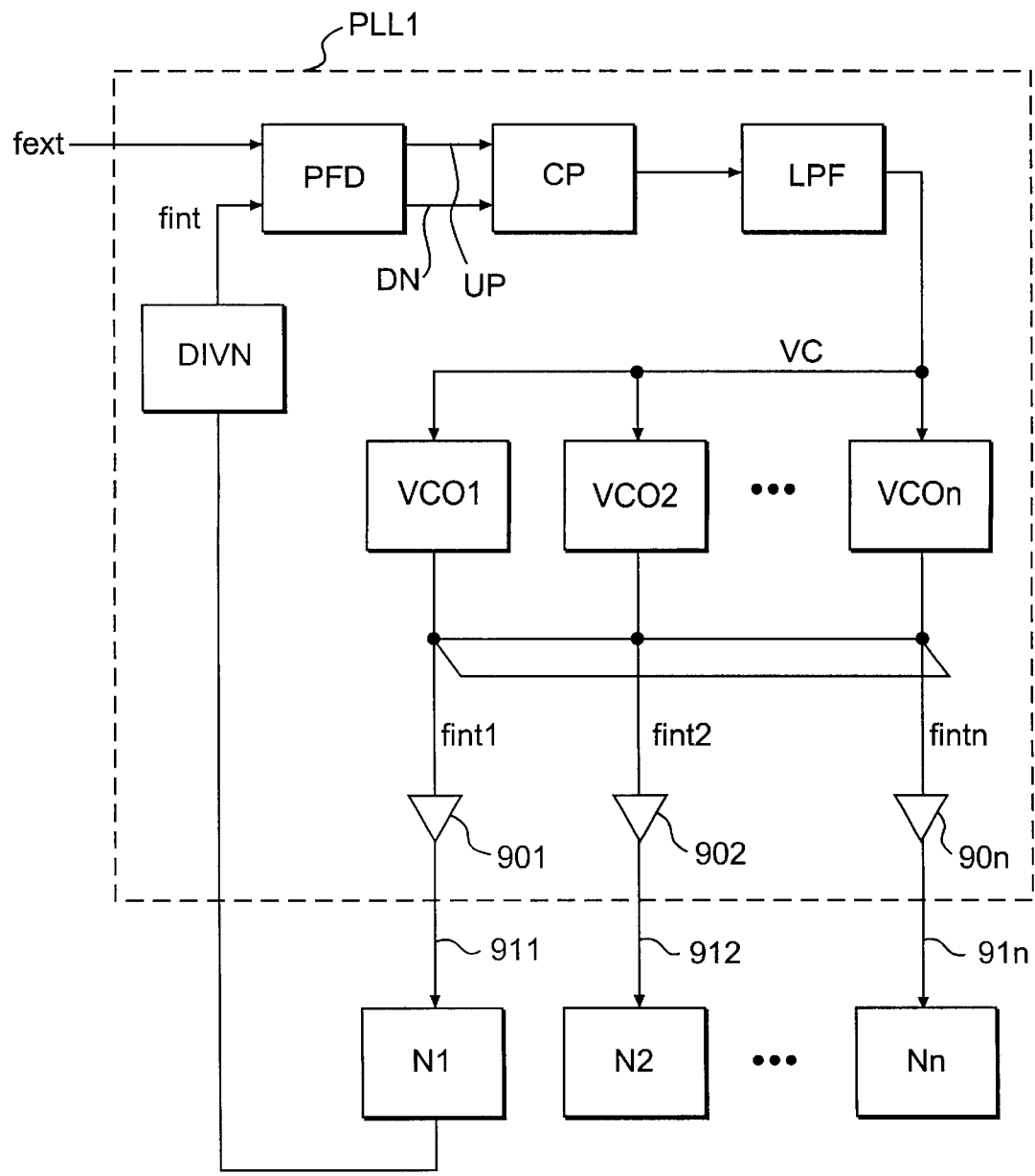
FIG. 11 is a diagram of an embodiment in which the oscillator of the present invention are used as voltage-controlled oscillators (variable-frequency oscillators) in a phase locked loop PLL circuit.

Although inverters of the single-end input/output type are employed in the embodiments of FIGS. 1 thru 4, differential inverters each having a differential input/output, OSC1*d*-OSC*nd* may well be employed as illustrated in FIG. 5 (the detailed circuit example of the differential inverter is depicted in FIG. 11 of the prior-art example A, and shall be omitted from illustration). In this case, the differential inverter has the oscillation outputs of a positive logic output and a negative logic output, so that equivalents to the nodes 101–10*n* in FIG. 1 become nodes (501*a*, 501*b*)-(50*na*, 50*nb*), which form dual rails.

Figure 6:
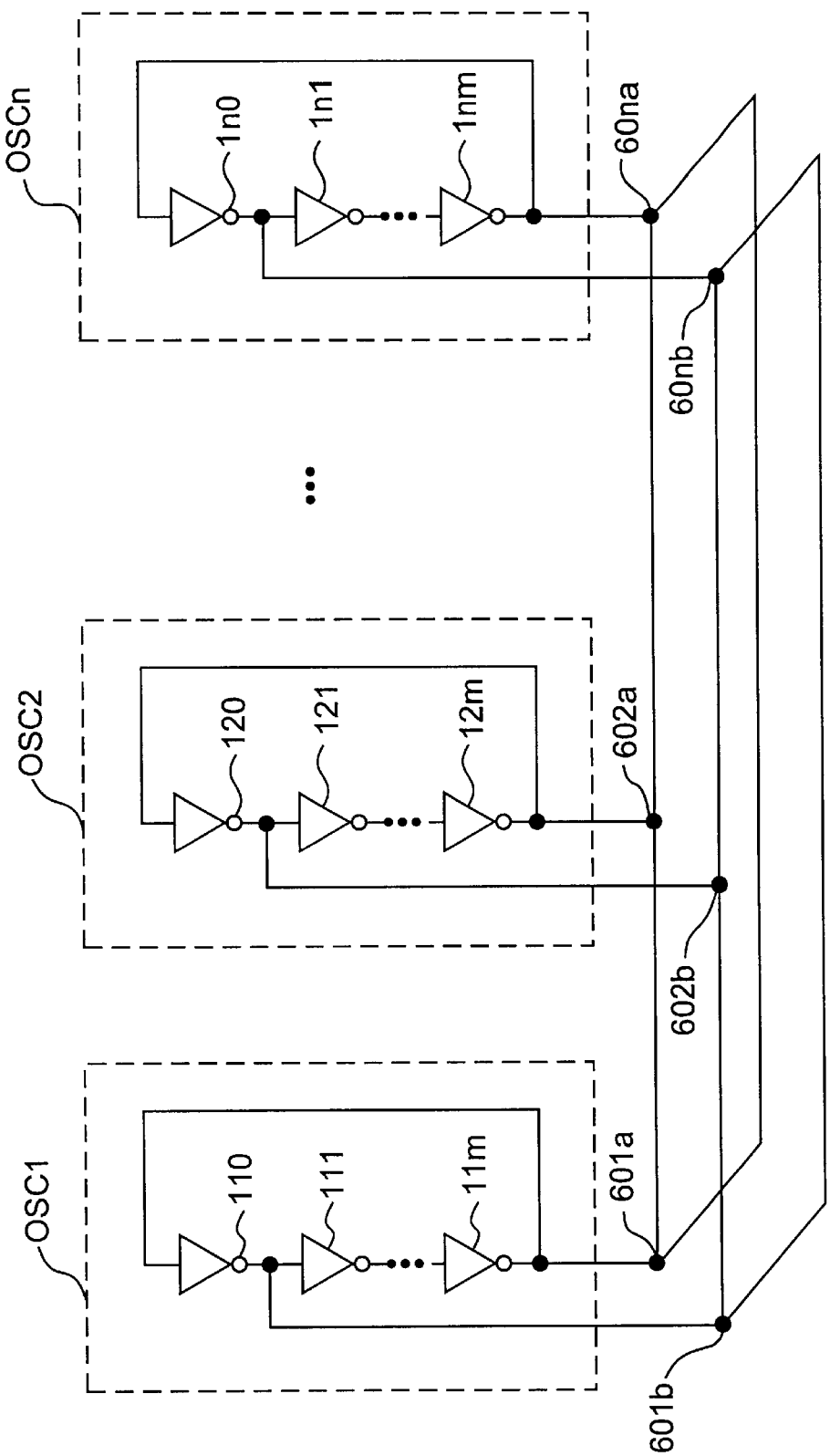
FIG. 6 is a diagram of an embodiment of the invention showing a different connection than that shown for the embodiment of FIG. 1.

Besides, although the ring oscillators are interconnected by using a particular one of the oscillation in the embodiments of FIGS. 1 thru 5, they may well be interconnected using a plurality of oscillation nodes (having different phases) of each of the oscillators as illustrated in FIG. 6. In FIG. 6, two nodes of each ring oscillator are used for the interconnections as shown at 601*a*–60*na* and 601*b*–60*nb*.

Since the degrees of coupling among the ring oscillators are intensified more than in the case of the connection aspect of FIG. 1, the noise immunity is enhanced.

Figure 7:
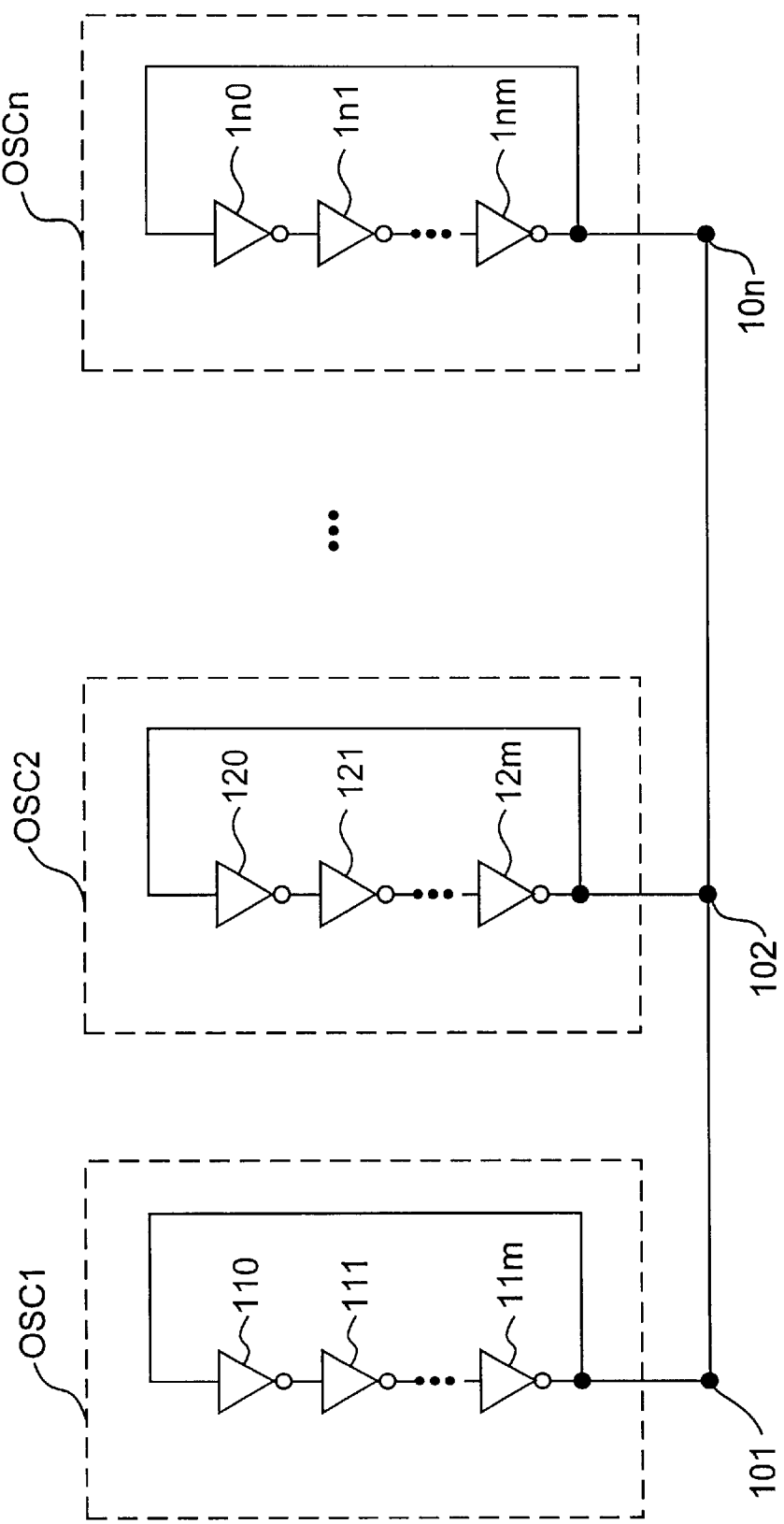
FIG. 7 is a diagram of an embodiment of the invention showing a different connection than that shown for the embodiment of FIG. 1.
Figure 8:
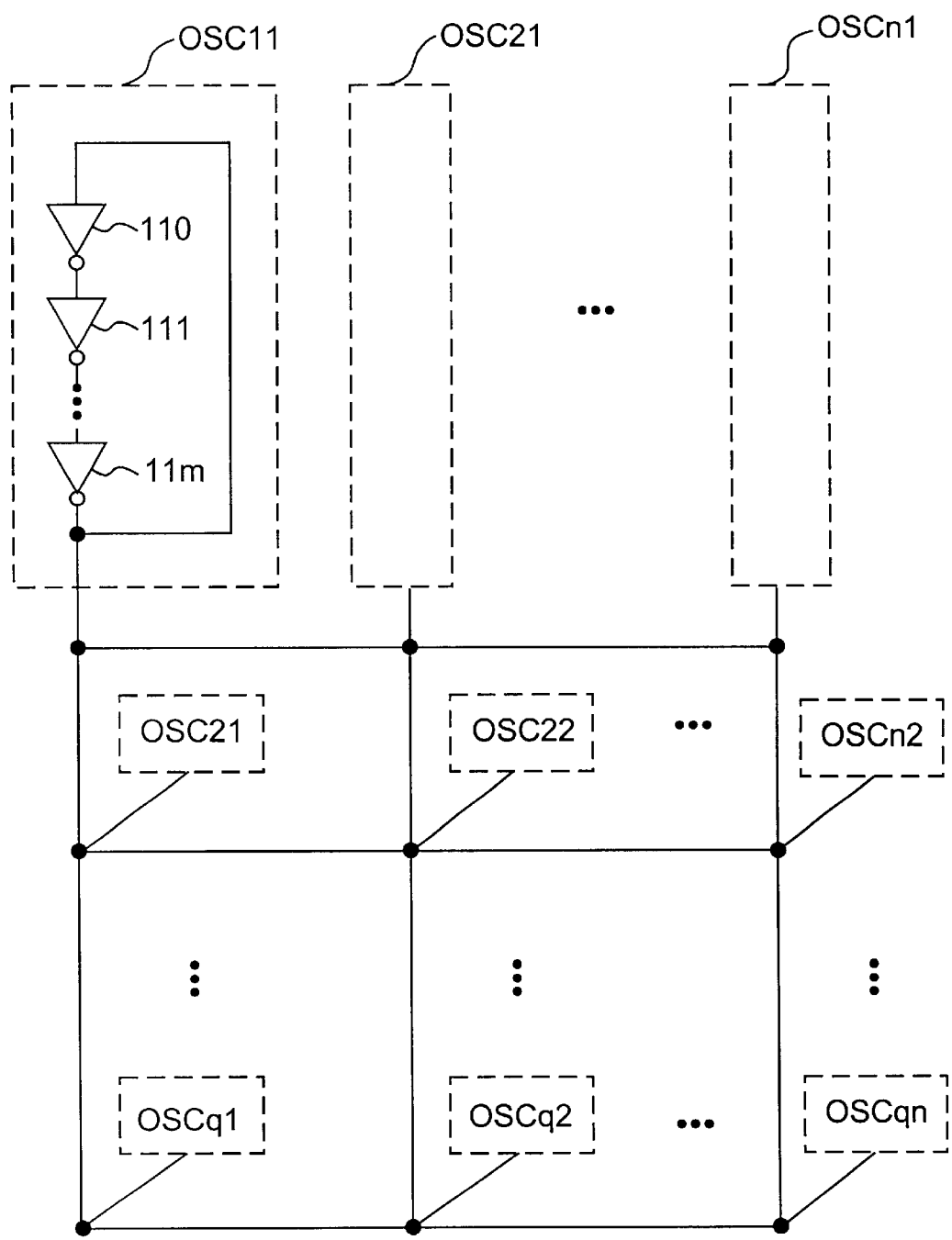
FIG. 8 is a diagram of an oscillation circuit embodiment of the invention in which ring oscillators are connected to a mesh in the shape of an array.

FIGS. 7 and 8 illustrate embodiments of the invention which differ from the former embodiments with respect to the connection of the oscillators. As compared with the embodiment of FIG. 1, the embodiment of FIG. 7 features the nonexistence of a wiring line part which directly connects the ring oscillators OSC1 and OSCn. On this occasion, even in the case where all of the distances between the respectively adjacent ones of the nodes 101–10n are the equal distances 1 and where all of the ring oscillators OSC1–OSCn have the same characteristics, the ring oscillators OSC1–OSCn do not oscillate in an identical phase though they really oscillate at an identical frequency. Herein, the ring oscillators OSC1–OSCn oscillate in synchronism while keeping phases δ1-δn. The phases δ1-δn can be made identical, not only by adjusting the distances between the respectively adjacent nodes, but also by adjusting the sorts (load driving capabilities, etc.) of the ring oscillators OSC1 thru OSCn. By way of example, the load driving capability of each of the ring oscillators OSC1 and OSCn at opposite ends of the oscillation circuit may be set to half the capability of the other ring oscillators.

FIG. 8 illustrates an embodiment in which the ring oscillators are connected together by a conductive wiring in the shape of an xq mesh. The mesh connection is useful for the practical application of the invention, however various connection aspects are considered to be part of the invention, and any connection aspect may be employed as long as the ring oscillators oscillate in synchronism as a result of the connection configuration. According to the invention, a plurality of oscillators which have a natural oscillation frequency that are substantially the same, are connected through nodes of the ring oscillators so that the oscillators oscillate at a substantially identical frequency. As a result, by the arrangement of FIG. 8, an effect which is similar to that of each of the embodiments illustrated in FIGS. 1 thru 4 is attained. In the ensuing description, embodiments employing the oscillator or oscillation circuit of the present invention shall be discussed using the embodiment of FIG. 1 for the sake of brevity.

Figure 9:
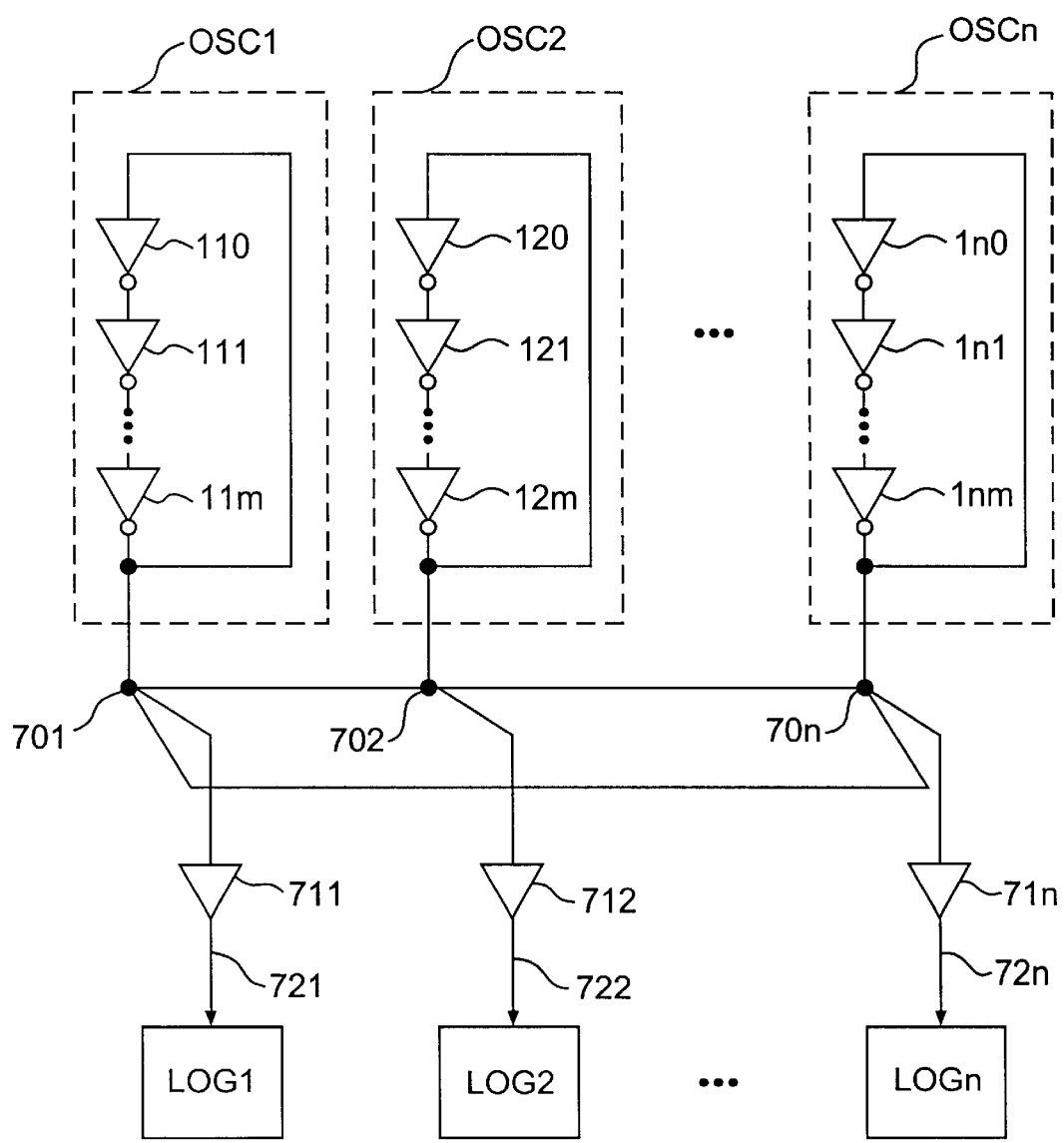
FIG. 9 is a diagram of an embodiment in which clocks are fed to a plurality of logic circuits by the use of the oscillator of the present invention.

FIG. 9 illustrates an embodiment of the invention in which clocks are fed to a plurality of logic circuits by the use of the oscillator of the present invention. LOG1–LOGn denote the logic circuits, while 711–71n denote buffers. In comparison with the embodiment of FIG. 1, the buffers 711–71n are connected to nodes 701–70n which correspond to the nodes 101–10n in FIG. 1, and the outputs 721–72n of these buffers are respectively fed to the logic circuits LOG1–LOGn. As stated before, the ring oscillators oscillate at a substantially identical frequency and at a substantially identical phase at the nodes 701–70n (although the ring oscillators can oscillate with phases δ1-δn as stated before, they are assumed to be connected to provide for oscillations of identical phase, for the sake of brevity). Thus, clock signals having no skew can be fed to the logic circuits LOG1–LOGn. Further, clock signal in which little jitter occurs can be fed owing to the noise immunity as stated before. Of course, the buffers 711–71n may well be omitted. When the buffers 711–71n are existent, the propagation of noise from the logic circuits LOG1–LOGn to the oscillator can be suppressed.

As seen from FIG. 3(B), skew at the nodes 701–70n in the presence of noise is less after some time period has lapsed subsequent to changes in the potentials of the nodes. Accordingly, the buffers 711–71n that are connected to the nodes 701–70n should preferably be Schmitt inputs. Thus, the skew of the outputs of the buffers 711–71n can be decreased.

In the embodiment of FIG. 9, the phases of the clock signals 721–72n input to the respective logic circuits LOG1–LOGn can be adjusted in the direction of delaying them individually, by adjusting the delay times of the corresponding buffers 711–71n.

Figure 10:
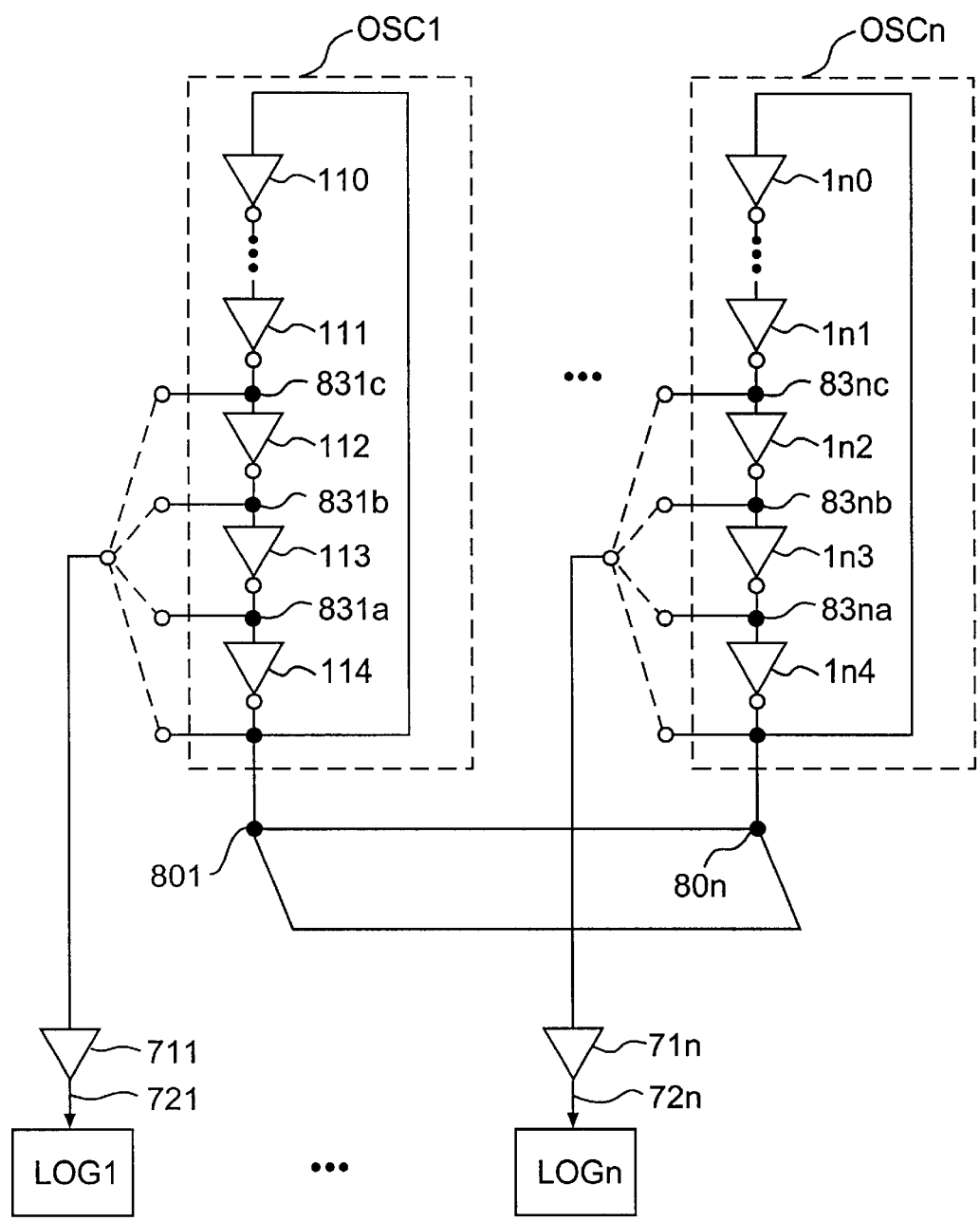
FIG. 10 is a diagram of an embodiment according to which, in the invention of FIG. 9, the phases of the clocks for the respective logic circuits are made to be adjustable.

FIG. 10 illustrates an embodiment in which the phases of the clocks 721–72n to be fed to the respective logic circuits can be further adjusted in the direction of advancing them. Oscillation nodes (831a, 831b, 831c, . . . )-(83na, 83nb, 83nc, . . . ) which differ from oscillation nodes 801–80n interconnecting the ring oscillators are selected, and the selected oscillation nodes are connected to the buffers 711–71n. By way of example, the oscillation node 831a oscillates in a phase which is earlier than that of the oscillation node 801 for one inverter stage (the phase is earlier by 360/p degrees under the assumption that the ring oscillator is configured of p stages of inverters of the same sort). Accordingly, when a clock is fed from the oscillation node 831a to the logic circuit LOG1 by the use of buffer 711, a phase thereof is earlier than that of the clock of a logic circuit as generated through the buffer from the oscillation node 801.

FIG. 11 illustrates an embodiment in which the oscillation circuit of the present invention is applied to the voltage-controlled oscillators (VCOs) of a PLL. VCO1–VCOn denote the voltage-controlled oscillators, and fint1-fintn indicate the output signals thereof. 901–90n indicate buffers, while N1–Nn indicate clock distribution networks. In comparison with the embodiment of FIG. 7, the voltage-controlled oscillators VOC1–VCOn correspond to the ring oscillators OSC1–OSCn, and an oscillation-frequency control signal VC therefor is controlled by a PLL structure, thereby to construct a phase-locked loop PLL1. In addition, global clocks 911–91n being the outputs of the buffers 901–90n are connected to the clock distribution networks N1–Nn.

Although for the sake of brevity, the connection of the voltage-controlled oscillators VCO1–VCOn is the same as that shown in FIG. 1, any of the connection types shown in FIGS. 4 thru 8 can be employed. Further, as compared with the prior-art example in FIG. 2, the embodiment in FIG. 11 does not show any circuit elements corresponding to the ½ frequency divider DIV2, but such elements may be connected at stages preceding or succeeding the buffers 901–90n if necessary.

Figure 12A:
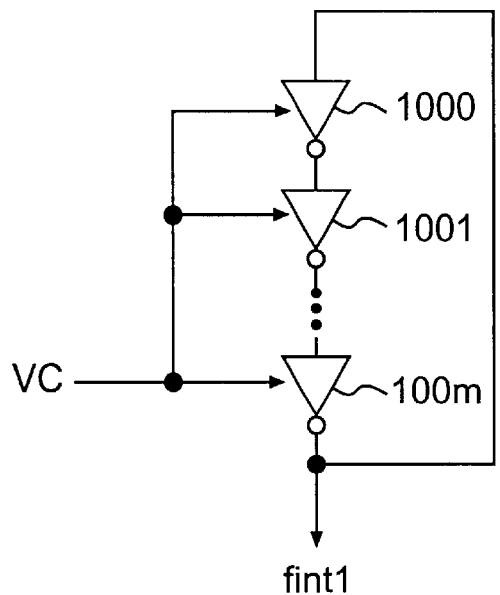
FIG. 12A is a diagram showing a basic embodiment of a voltage-controlled oscillator.
Figure 12B:
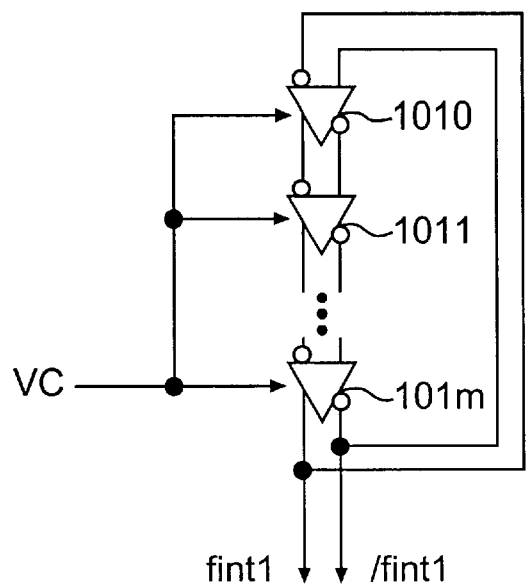
FIG. 12B is a diagram showing another basic embodiment of a voltage-controlled oscillator.

Circuit examples of each of the oscillators VCO1–VCOn are illustrated in FIGS. 12(A) and 12(B). FIG. 12(A) shows an oscillator configured of inverters 1000–100m each having a single-end input/output. The delay time of each inverter changes depending upon the value of the oscillation-frequency control signal VC, whereby the oscillation frequency of the oscillation output fint1 changes depending upon the value of the oscillation-frequency control signal VC (a detailed circuit example of the inverter is depicted in FIG. 4 of the prior-art example A, and therefore its detail is omitted from illustration).

On the other hand, FIG. 12(B) shows an oscillator which is configured of differential inverters 1010–101m each having a differential input/output. In the same manner as in FIG. 12(A), the delay time of each differential inverter changes depending upon the value of the oscillation-frequency control signal VC, whereby the oscillation frequencies of the oscillation outputs fint1 and /fint1 change depending upon the value of the oscillation-frequency control signal VC (a detailed circuit example of the differential inverter is depicted in FIG. 11 of the prior-art example A, and therefore its detail is omitted from illustration).

Figure 13:
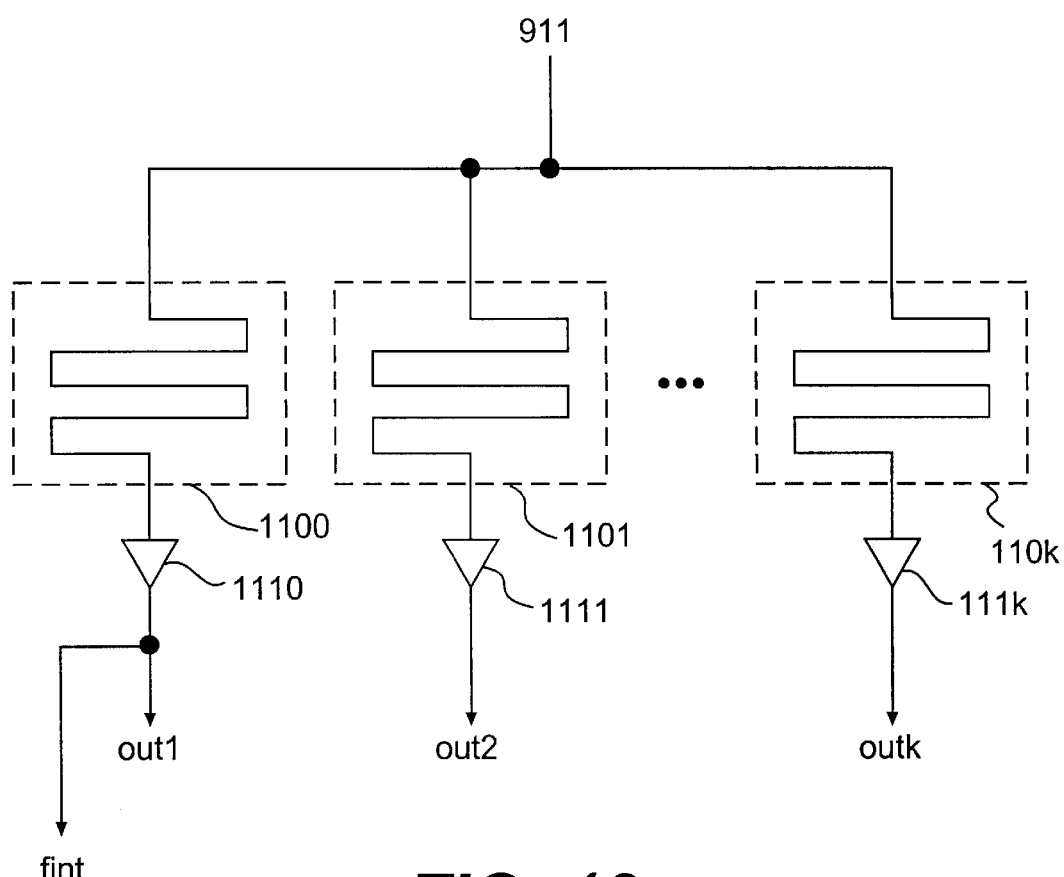
FIG. 13 is a diagram of a basic embodiment of a clock distribution network according to the present invention.

FIG. 13 is a detailed diagram of the clock distribution network N1 shown in FIG. 11. 1100–110k indicate clock distribution lines, while 1110–111k indicate local buffers. The lengths of the respective clock distribution lines 1100–110k are set on a chip layout so that lengths from the global clock 911 to the respective local buffers 1110–111k may become equal. Accordingly, the characteristics of the local buffers 1110–111k are substantially identical (hereinbelow, termed "matched"). Furthermore, in the absence of noise, the skews of local clock outputs out1-outk become zero.

Since the voltage-controlled oscillators VCO1–VCOn are fed with an identical oscillation-frequency control signal VC, the oscillation outputs fint1 thru fintn thereof oscillate with a substantially identical frequency/identical phase as stated before (although the voltage-controlled oscillators VCO1–VCOn can oscillate with phases δ1-δn as stated in conjunction with the embodiments shown in the figures up to FIG. 8, they are assumed to be connected to provide for oscillations of substantially identical phase, for the sake of brevity here). Accordingly, the local clock outputs out1-outk oscillate at the substantially identical frequency and phase. Furthermore, since noise immunity similar to that achieved in the embodiments illustrated in the figures before FIG. 10 is attained, there is substantially no increase in the skew/jitter of the outputs due to supply voltage fluctuations or substrate voltage fluctuation.

Figure 14:
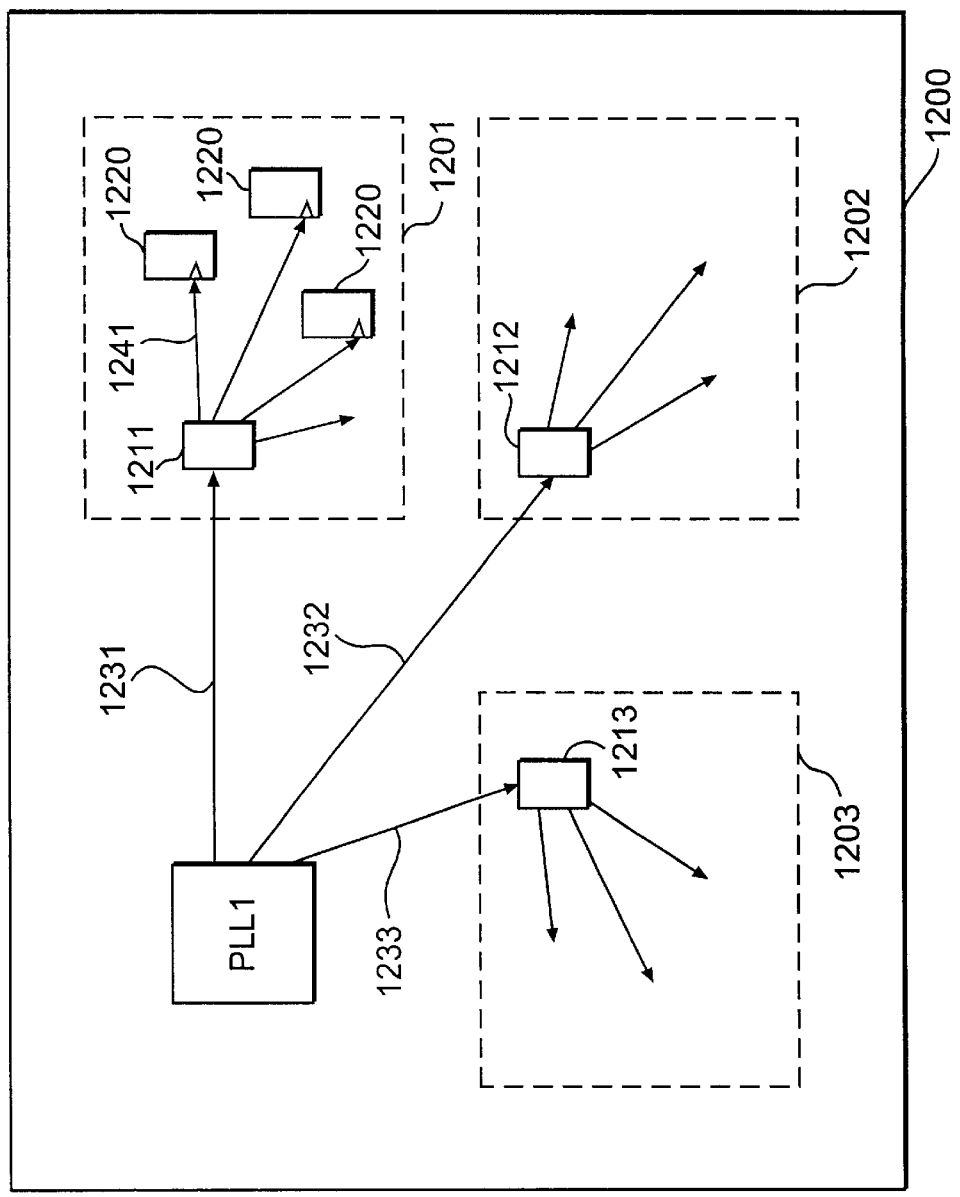
FIG. 14 is a diagram of a microprocessor according to the present invention.

FIG. 14 illustrates an embodiment in which the PLL of FIG. 11 is applied to a microprocessor that requires high performance from the PLL, even among the semiconductor integrated circuit devices. Numeral 1200 designates the microprocessor, numerals 1201–1203 designate logic circuit blocks, and constituents 1211–1213 correspond to the clock distribution networks in FIG. 11. The functions of the logic circuit blocks are not especially restricted. The logic circuit block may be either a data path with an arithmetic unit etc. built therein, or a memory such as cache or a controller therefor.

Global clocks 1231–1233 are output from the phase-locked loop PLL1. The global clocks 1231–1233 are distributed into local clocks 1241 within the respective logic circuit blocks by the clock distribution networks 1211–1213. Lastly, the local clocks 1241 are fed to the clock input units of circuits such as latches 1220.

As in the embodiment of FIG. 11, there is substantially no increase in the skew/jitter of the local clocks 1241 due to supply voltage fluctuations or substrate voltage fluctuation. Further, the voltage-controlled oscillators VCO1–VCOn within the phase-locked loop PLL1 are sporadically situated in the chip and are arranged near the logic circuit blocks to which they are allotted, whereby paths from the clock outputs of the voltage-controlled oscillators VCO1–VCOn to the circuits, such as latches to use the corresponding clock outputs, can be shortened (the path includes, e.g., the global clock 1231, clock distribution network 1211 and local clock 1241 in FIG. 14). When the path is shortened, a delay time which is involved therein can be shortened. It is therefore possible to mitigate the influence which skew or jitter having occurred in the path exerts on the performance of the whole clock distribution system.

In an arrangement (hereinbelow, called the "multiple PLL scheme") wherein a clock feed range within a chip is split in a large number and wherein independent PLLs are respectively disposed for the resulting clock feed subranges, the clock skew between the independent clock feed subranges becomes TskewG+2*TskewL+2*Tjitter, where TskewL denotes the skew within each clock feed subrange, Tjitter denotes the jitter of the PLL, and TskewG denotes the skew of the reference clock having occurred up to each PLL. With the arrangement of the present invention, the clock skew becomes 2*TskewLN+TjitterN where TjitterN denotes the jitter of the global clock output from the phase-locked loop PLL1, and TskewLN denotes the skew of the corresponding one of the clock distribution networks 1211–1213. Even when TskewL=TskewLN is assumed, by the present invention the clock skew can be decreased. In actuality, TjitterN<Tjitter holds for the PLL of the present invention as stated before, so that the arrangement of the present invention can sharply reduce the clock skew.

Furthermore, a chip area can be made smaller by the scheme of the present invention in which a larger number of VCOs than in the multiple PLL scheme are sporadically situated in the chip and are synchronized.

Although the embodiments in each of which the external clock and the internal clock are synchronized using the PLL scheme have been mentioned in the foregoing, a delayed locked loop (DLL) scheme may well be employed. By way of example, the present invention is readily applied to a DLL in such a way that the DLL is constructed by replacing the ring oscillators in FIG. 1 with delay lines.

Figure 15:
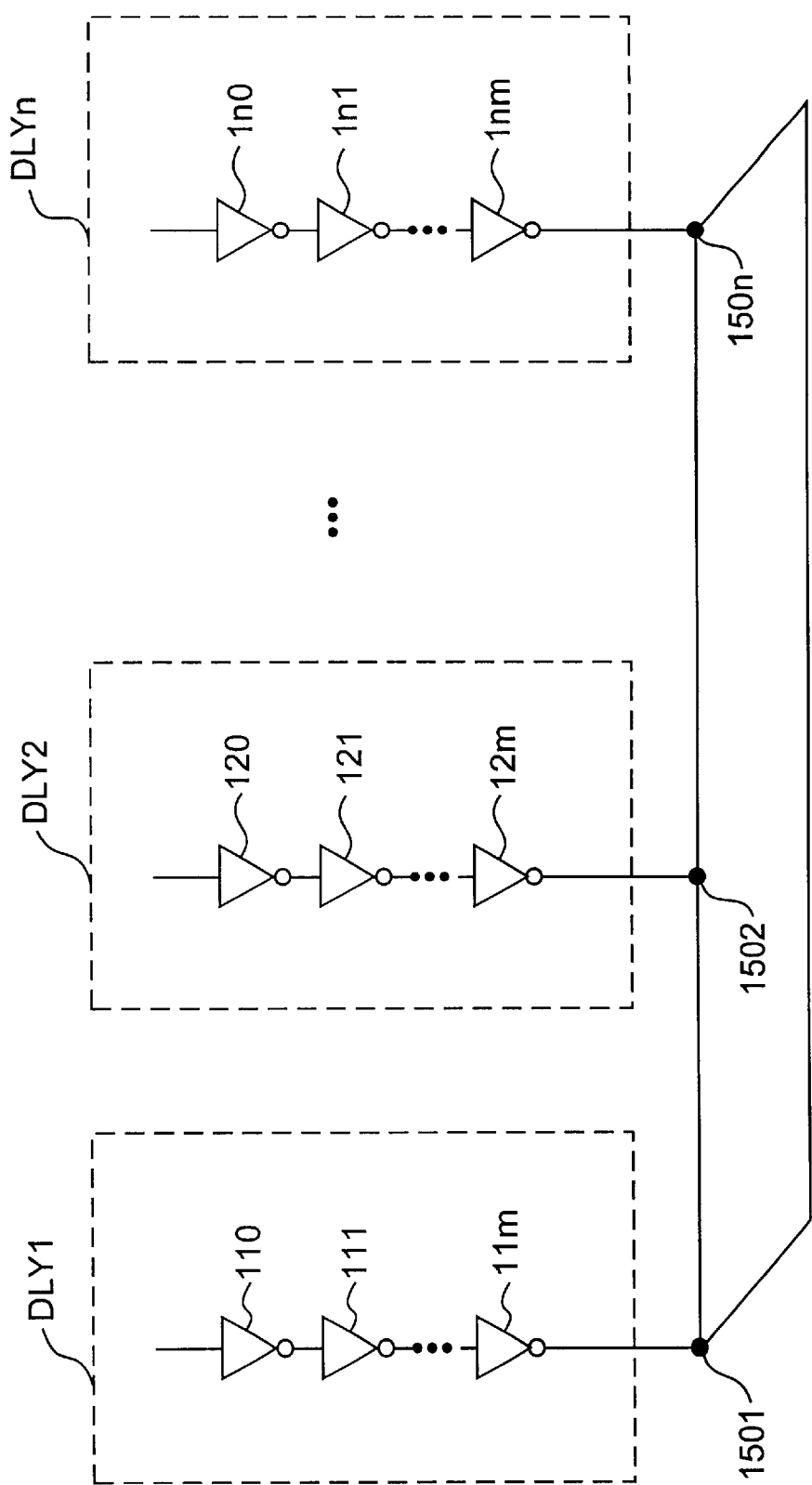
FIG. 15 is a diagram of an embodiment in which the present invention is applied to delay lines.
Figure 16:
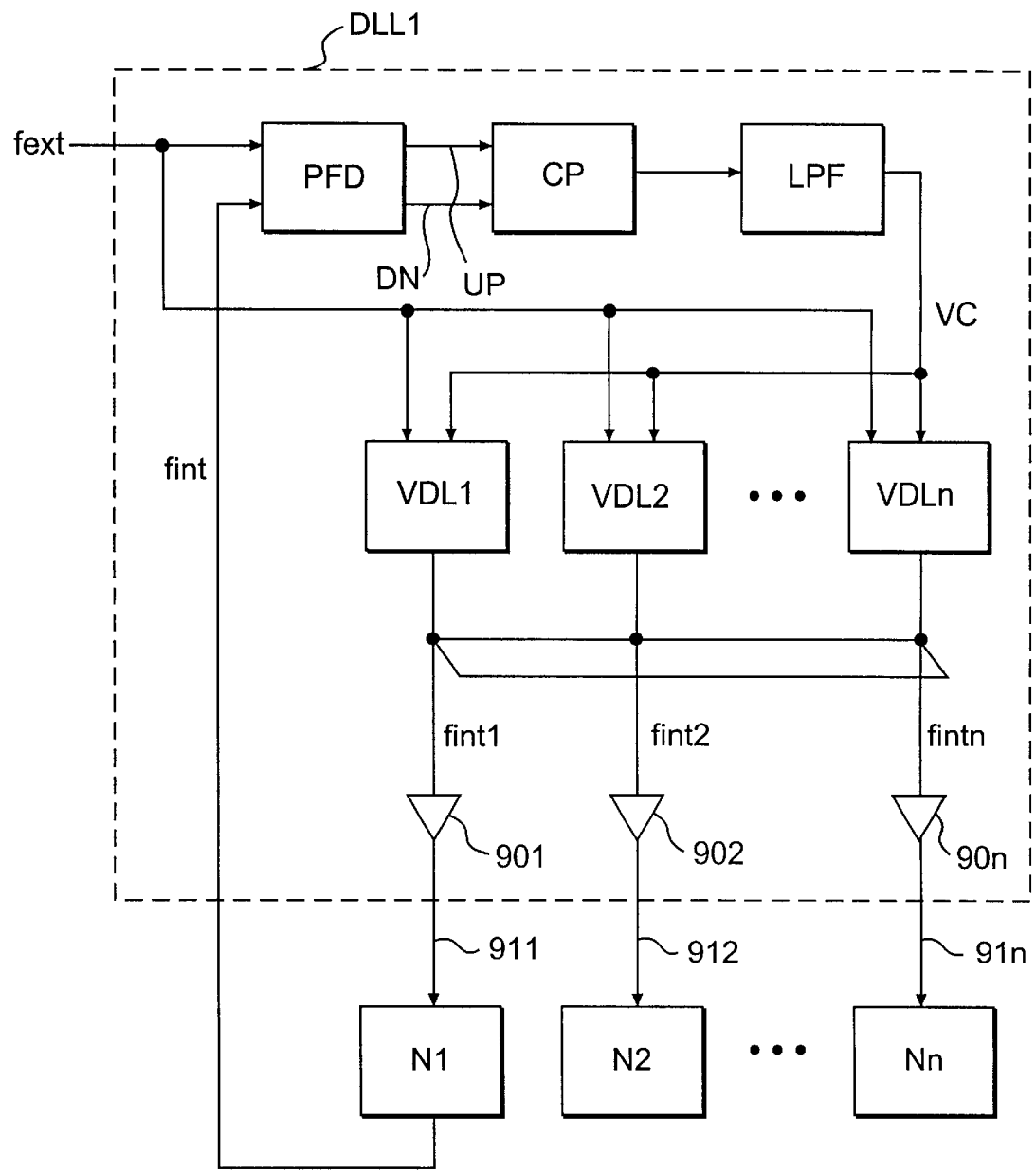
FIG. 16 is a diagram of an embodiment in which a delayed lock loop (DLL) is constructed using voltage-controlled delay lines (variable delay lines) as the delay lines in FIG. 15.

FIG. 15 illustrates such an embodiment. Further, FIG. 16 illustrates an embodiment in which a DLL is constructed by laying the delay lines in FIG. 15 as variable delay lines. As compared with the embodiment of FIG. 11, the embodiment of FIG. 16 differs in the point that the reference clock fext is input to the variable delay lines VDL1–VDLn. Otherwise, it is obvious that the embodiment of FIG. 15 is applicable to each of the embodiments of the present invention illustrated in FIGS. 2 thru 14.

Each of the foregoing embodiments corresponds to the case where the present invention is applied within a single chip, but obviously it can be expanded to embodiments of semiconductor integrated circuit devices each of which includes a plurality of chips. By way of example, the present invention is readily applied to a case where, as in FIG. 14, the logic circuit blocks and the voltage-controlled oscillators VCOs allotted thereto are constructed using respectively separate chips, or a case where, as in FIG. 1, the ring oscillators are constructed using respectively separate chips.

In addition, none of the foregoing embodiments includes a method for lowering power dissipation, such as so-called gated clock. The present invention, however, is readily applied to a case, for example, where the buffers 711–71n in FIG. 10 are altered into and constructed as gate circuits. Although there are various different methods, the present invention is not especially restricted to such methods, and one such method for lowering power dissipation is provided by an arrangement shown in FIG. 17(A).

Figure 17A:
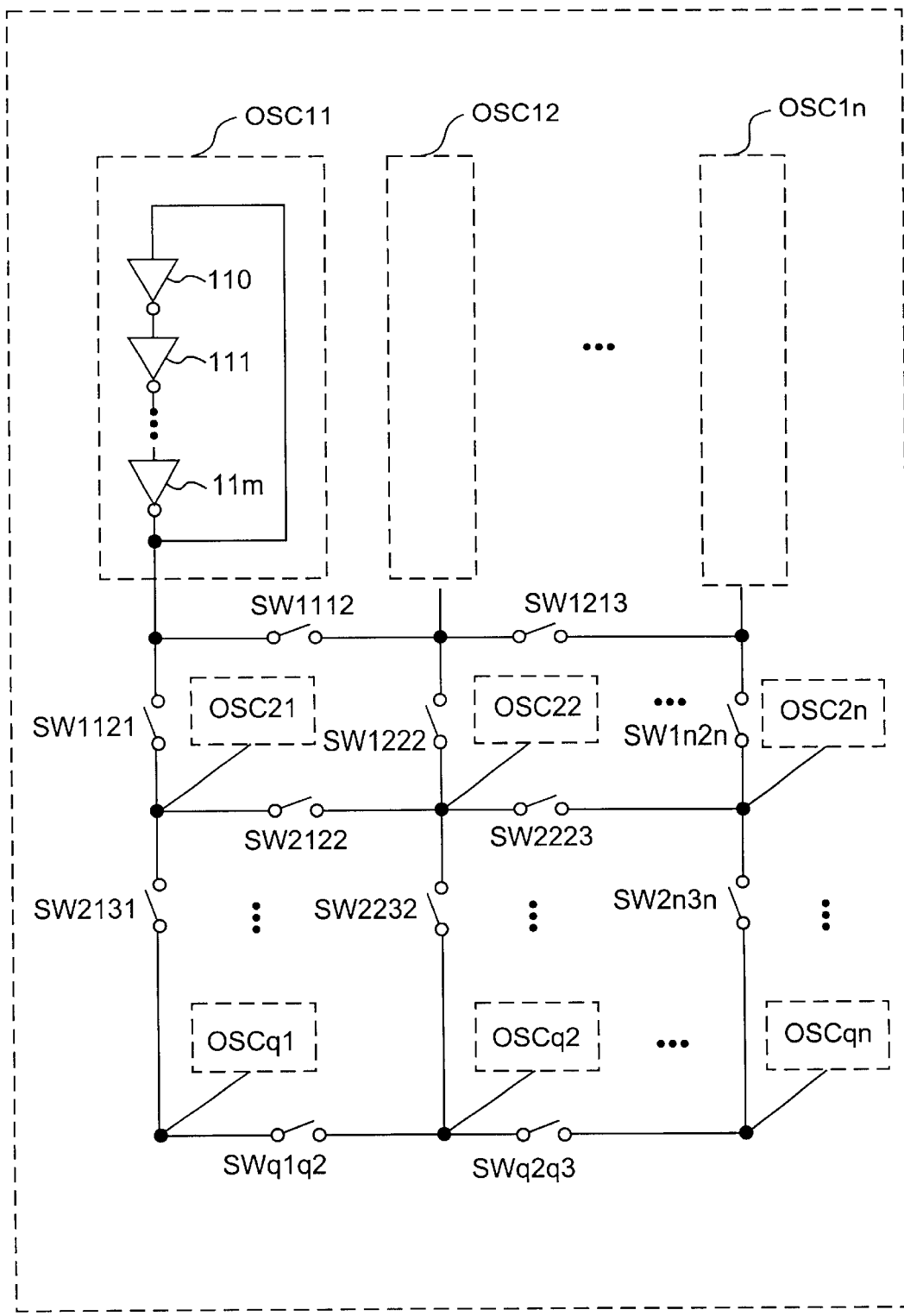
FIG. 17A is diagram of the embodiment of the invention shown in FIG. 8 with switches interposed between the connection points of the mesh.
Figure 17B:
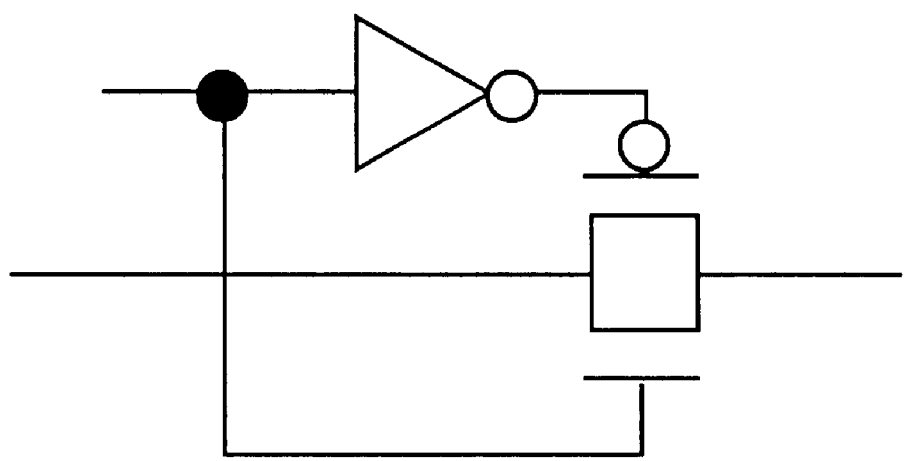
FIG. 17B is a diagram of a switch used in the embodiment of FIG. 17B.

In FIG. 17(A), an arrangement is shown using switches in which only part of the many oscillators used in the present invention need be operated at any one time in order to selectively lower power dissipation. FIG. 17(B) shows a preferred embodiment of one of the switches shown in FIG. 17(A).

As shown in FIG. 17(A), the switches are connected to the wiring lines interconnecting the ring oscillators in the embodiment where the ring oscillators are connected in a mesh of n×q, according to the embodiment of FIG. 8. The switches may be, for example, CMOS switches as shown in FIG. 17(B), although not limited thereto.

When all of the ring oscillators are to be operated, all of the switches are turned on. Meanwhile when, for example, it is desired that only the ring oscillators OSC11, OSC12, OSC21, OSC22 are operated and the other oscillators are not operated, switches SW1213, SW2223, SW2232, SW2131 are turned off. By turning off the switches SW1213, SW2223, DE2232, SW2131, the not-operating ring oscillators do not influence the ring oscillators OSC11, OSC12, OSC21, OSC22. In order to reduce the power consumption by supplying clock signals to only part of the circuits, for example, the structure and control method of the invention can be used.

Figure 18:
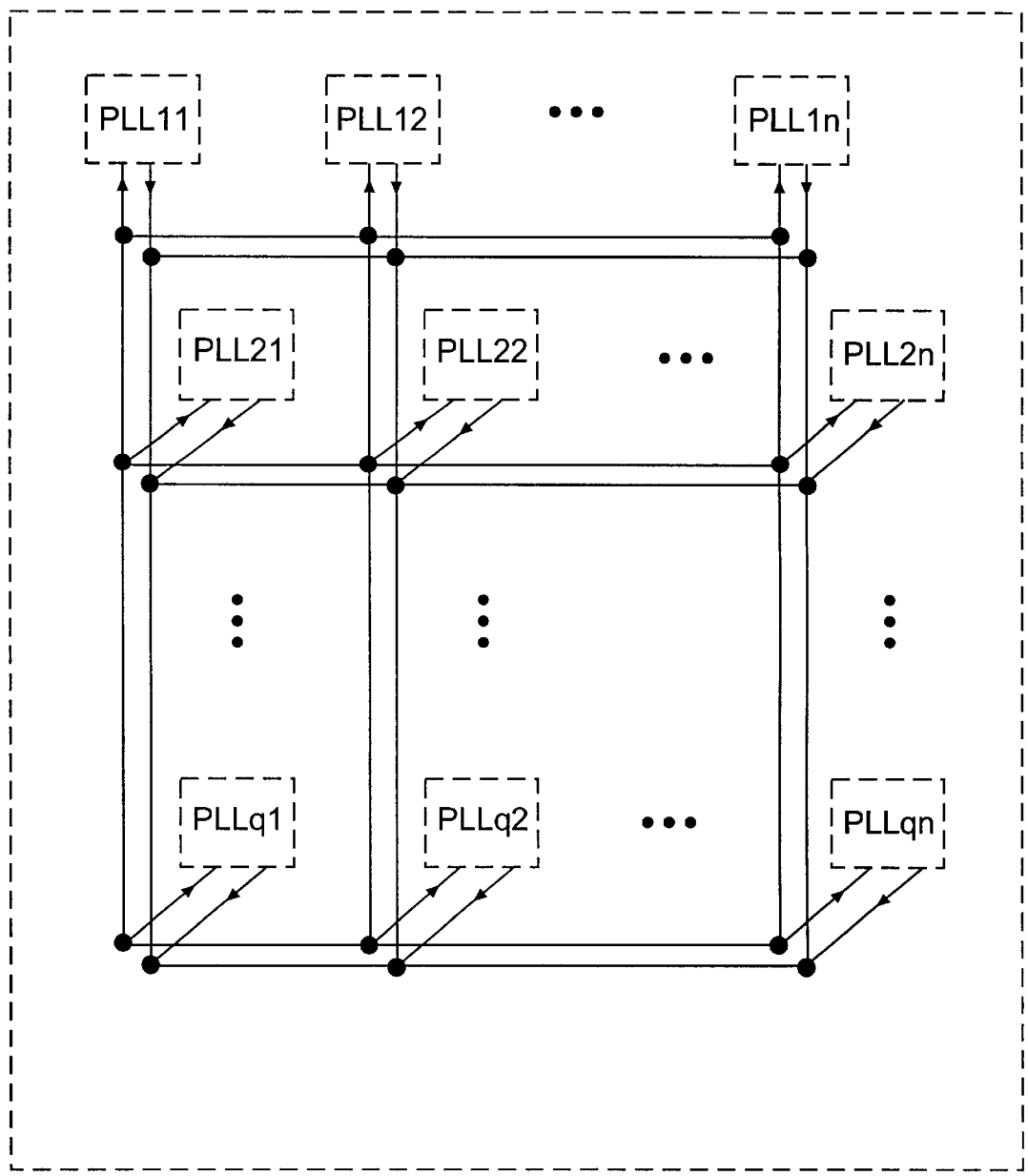
FIG. 18 is a diagram of an embodiment similar to that of FIG. 8 with PLLs used in place of the ring oscillator shown in FIG. 8.

In the foregoing examples, although it is premised that the frequency of the ring oscillators is controlled by the oscillation-frequency control signal, the ring oscillators may be the ones whose frequency is determined by a clock inputted from outside. This can be realized by, e.g. adopting a PLL structure. FIG. 18 shows a structure wherein instead of the to the oscillators OSC11-OSCqn used in the embodiment of FIG. 8, there are provided phase lock loop circuits PLL11 to PLLqn that receive a clock from outside (not shown).

The PLL circuits shown in FIG. 18 have an input and an output respectively connected to separate first and second conductive wirings, each in the shape of a mesh. The phase and frequency of the outputs is synchronized for each of the outputs of the PLL circuits that is connected to the first conductive wiring. On the other hand, a reference clock signal is input to each of the PLL circuits connected to the second conductive wiring. The second conductive wiring of FIG. 18 is used to distribute the reference clock signal as an input to each of the PLLs with the same frequency and phase, so the shape of the wiring is not limited to the mesh shape shown in the figure, but may take another form so long as this function is performed. If there is a slight variation in the frequency of the reference clock signal input through the first conductive wiring to each of the PLL circuits, there is substantially no variation in the output clock signal from each of the PLL circuits because of the effect achieved by the present invention wherein each of the oscillators of the PLL circuits are connected together by the second wiring.

As compared with the previous embodiments (FIGS. 8 and 11, for example) in which the frequency control signal for the oscillators is distributed over the entire chip, the present embodiment uses the reference clock signal as an output to the PLL circuits so that distribution of a frequency control signal is not required. Accordingly, the present embodiment enables the distribution of the input reference clock signal according to the known technology of distributing a clock signal. Further, according to this embodiment, a stable output clock signal is distributed that does not vary between each PLL circuit even when there are variations in the phase of the reference clock signal input to each of the PLL circuits. Accordingly, the clock signal provided that is distributed according to this embodiment is not subject to variations due to noise.

Figure 19:
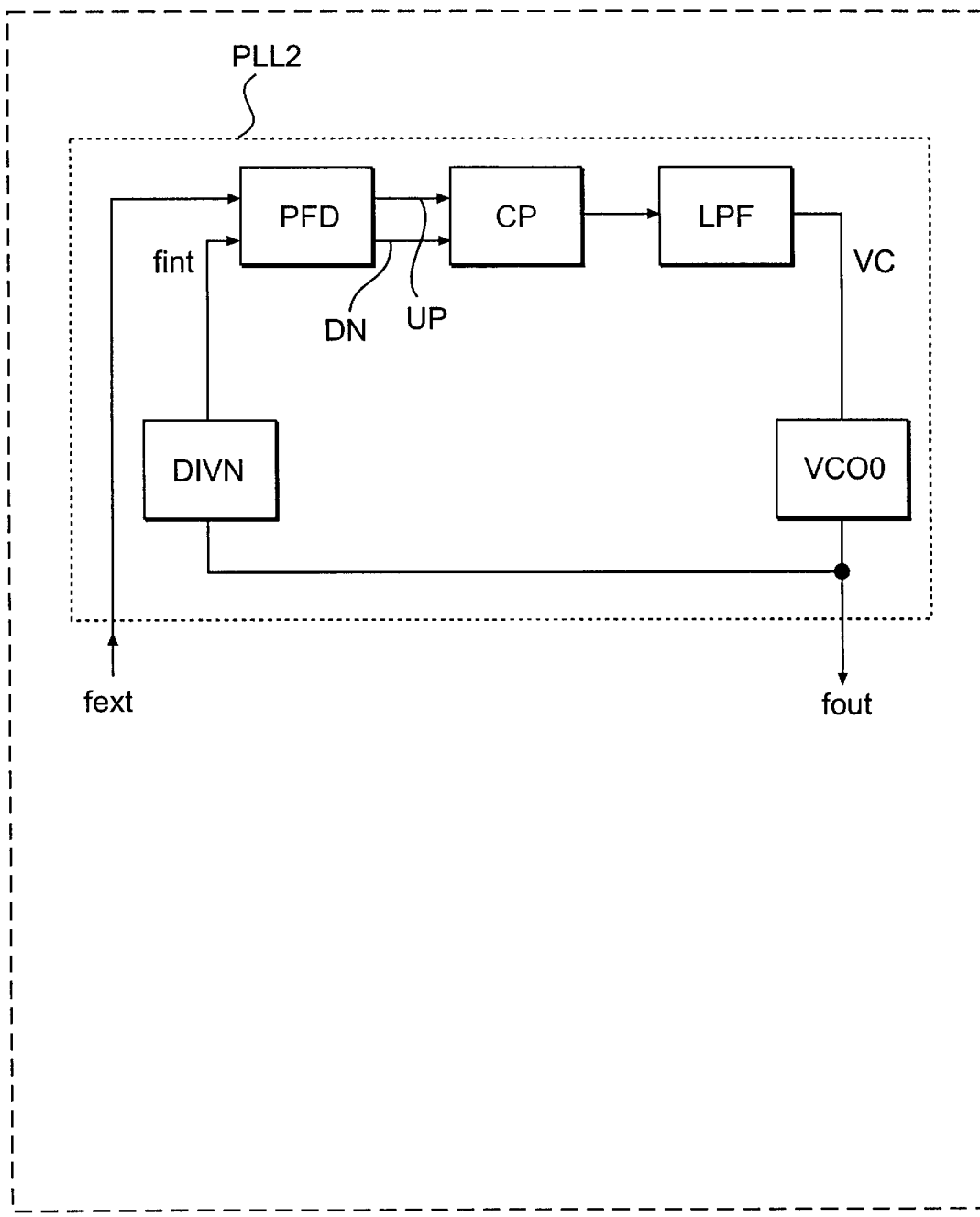
FIG. 19 is a diagram of an embodiment of the PLLs used in FIG. 18.

FIG. 19 illustrates an example of each of the PLLs, PLL11 to PLLqn, used in FIG. 18. The symbols used in FIG. 19 are identical with those of FIG. 2, and therefore further description thereof will be omitted.

Although some of the foregoing embodiments employ ring oscillation circuits in which a plurality of inverters are connected in a ring shape in multistage fashion, the present invention is not restricted to such a construction. Alternatives to the ring oscillation circuit may be employed in the present invention. It suffices that the oscillation frequency and phase of the oscillation circuit can be adjusted using the oscillation output thereof as input/output lines, and that a plurality of such oscillation circuits connected as described can oscillate in synchronism.

Further, in each of the foregoing embodiments, the semiconductor process, the transistor structure, etc. used in the present invention is not particularly described. A CMOS process may be employed, and an SOI transistor made from an SOI wafer may be employed. No specific limitations are placed on the type of the supply voltages or the sorts thereof.

As set forth herein, according to the present invention, it is possible to provide clock signals and a clock distribution circuit or system of circuits having low skew and low jitter to logic circuits and memory circuits of a microprocessor or the like. Further, a semiconductor integrated circuit device of high speed can be provided as a result of the stable clock signal that is able to be generated and distributed in accordance with the present invention.

While preferred embodiments have been set forth with specific details, further embodiments, modifications and variations are contemplated according to the broader aspects of the present invention, all as determined by the spirit and scope of the following claims.

We claim:

1. A semiconductor integrated circuit device comprising:
   a plurality of circuit blocks;
   a plurality of separate oscillators each having an oscillation node; and
   a conductive wiring line;
   wherein oscillation nodes of said plurality of separate oscillators are connected to said conductive wiring line at connection points at spaced intervals of length along said conductive wiring line, wherein the oscillation nodes can both receive an input signal from the conductive wiring line and output an oscillation signal to the conductive wiring line; and
   wherein each of said plurality of separate oscillators supplies the oscillating signal to each of said plurality of circuit blocks respectively.

2. A semiconductor integrated circuit device, according to claim 1,
   wherein said each of said plurality of separate oscillators is a ring oscillator including a plurality of inverters; and
   wherein an output of one of said plurality of inverters is connected to both said conductive wiring line and an input of another of said plurality of inverters.

3. A semiconductor integrated circuit device, according to claim 1,
   wherein a shape of said conductive wiring line is a closed loop.

4. A semiconductor integrated circuit device, according to claim 1,
   wherein a shape of said conductive wiring line is a mesh;
   wherein said oscillation nodes are connected at intersection points of said mesh respectively.

5. A semiconductor integrated circuit device, according to claim 1,
   wherein said spaced intervals of length are substantially equal.

6. A semiconductor integrated circuit device, according to claim 2,
   wherein said spaced intervals of length and load driving capabilities of said plurality of inverters are determined so that said plurality of separate oscillators are synchronized to oscillate with a substantially identically frequency at each of said oscillation nodes.

7. A semiconductor integrated circuit device, according to claim 6,
   wherein said spaced intervals of length and load driving capabilities of said inverters are determined so that said plurality of separate oscillators are synchronized to oscillate with a substantially identically phase at each of said oscillation nodes.

8. A semiconductor integrated circuit device, comprising:
   a plurality of circuit blocks each having a clock distribution network;
   a frequency divider dividing a clock signal of said clock distribution network of one of said circuit blocks;
   a phase/frequency comparator comparing said clock signal divided by said frequency divider with a reference clock signal and outputting an error signal;
   a plurality of separate voltage-controlled oscillators each having an oscillation node and outputting an oscillation signal in accordance with said error signal;
   a conductive wiring line;
   wherein oscillation nodes of said plurality of separate voltage-controlled oscillators are connected to said conductive wiring line at connection points at spaced intervals of length along said conductive wiring line, wherein the oscillation nodes can both receive an input signal from the conductive wiring line and output an oscillation signal to the conductive wiring line; and
   wherein each of said plurality of separate voltage-controlled oscillators supplies said oscillating signal to said clock distribution network of each of said plurality of circuit blocks respectively.

9. A semiconductor integrated circuit device, according to claim 8,
   wherein said each of said plurality of voltage-controlled oscillators includes a plurality of inverters whose delay is variable in accordance with said error signal; and
   wherein an output of one of said plurality of inverters is connected to both said conductive wiring line and an input of another of said plurality of inverters.

10. A semiconductor integrated circuit device, according to claim 8,
    wherein a shape of said conductive wiring line is a closed loop.

11. A semiconductor integrated circuit device, according to claim 8,
    wherein a shape of said conductive wiring line is a mesh; wherein said oscillation nodes are connected at intersection points of said mesh respectively.

12. A semiconductor integrated circuit device, according to claim 8,
    wherein said intervals of length are substantially equal.

13. A semiconductor integrated circuit device, according to claim 9,
    wherein said spaced intervals of length and load driving capabilities of said inverters are determined so that said oscillators are synchronized to oscillate with a substantially identical frequency at each of said oscillation nodes.

14. A semiconductor integrated circuit device, according to claim 13,
    wherein said spaced intervals of length and load driving capabilities of said inverters are determined so that said oscillators are synchronized to oscillate with a substantially identical phase at each of said oscillation nodes.

15. A semiconductor integrated circuit device comprising:
    a plurality of circuit blocks;
    a plurality of separate oscillators each having an oscillation node; and
    a conductive wiring line;
    wherein oscillation nodes of said plurality of separate oscillators are connected to said conductive wiring line at connection points at spaced intervals of length along said conductive wiring line, wherein the oscillation nodes can both receive an input signal from the conductive wiring line and output an oscillation signal to the conductive wiring line; and
    wherein each of said plurality of separate oscillators supplies an oscillating signal to each of said plurality of circuit blocks, respectively, such that a clock feed range of each oscillator is reduced, thereby reducing overall clock skew for the semiconductor integrated circuit device.

16. A semiconductor integrated circuit device according to claim 1, wherein the conductive wiring line is provided with a plurality of switches such that only certain ones of the plurality of separate oscillators are operated at any one time in order to selectively lower power dissipation.

17. A semiconductor integrated circuit device according to claim 8, wherein the conductive wiring line is provided with a plurality of switches such that only certain ones of the plurality of separate voltage-controlled oscillators are operated at any one time in order to selectively lower power dissipation.

* * * * *